US012645969B2

(12) United States Patent
Gonzalez-Zalba

(10) Patent No.: US 12,645,969 B2
(45) Date of Patent: Jun. 2, 2026

(54) COMPACT SILICON QUBIT CELL WITH EMBEDDED READOUT

(71) Applicant: Quantum Motion Technologies Limited, London (GB)

(72) Inventor: Miguel Fernando Gonzalez-Zalba, Harrogate (GB)

(73) Assignee: QUANTUM MOTION TECHNOLOGIES LIMITED, London (GB)

( * ) Notice: Subject to any disclaimer, the term of this patent is extended or adjusted under 35 U.S.C. 154(b) by 469 days.

(21) Appl. No.: 18/275,998

(22) PCT Filed: Mar. 4, 2022

(86) PCT No.: PCT/EP2022/055531
§ 371 (c)(1),
(2) Date: Aug. 4, 2023

(87) PCT Pub. No.: WO2022/189284
PCT Pub. Date: Sep. 15, 2022

(65) Prior Publication Data
US 2024/0127098 A1 Apr. 18, 2024

(30) Foreign Application Priority Data

Mar. 8, 2021 (EP) ..................................... 21161175

(51) Int. Cl.
| | |
|---|---|
| *H10N 60/01* | (2023.01) |
| *G01R 21/00* | (2006.01) |
| *G06N 10/40* | (2022.01) |
| *H01P 7/08* | (2006.01) |
| *H03K 17/92* | (2006.01) |
| *H10N 60/10* | (2023.01) |

(52) U.S. Cl.
CPC ............. *G06N 10/40* (2022.01); *G01R 21/00* (2013.01); *H01P 7/08* (2013.01); *H03K 17/92* (2013.01);
(Continued)

(58) Field of Classification Search
CPC ................................ H10N 69/00; B82Y 10/00
See application file for complete search history.

(56) References Cited

U.S. PATENT DOCUMENTS

2016/0300155 A1* 10/2016 Betz ........................ H10D 64/27
2017/0308804 A1 10/2017 Wabnig et al.
(Continued)

FOREIGN PATENT DOCUMENTS

GB 2531517 4/2016

OTHER PUBLICATIONS

Samkharadze et al., "High Kinetic Inductance Superconducting Nanowire Resonators for Circuit QED in a Magnetic Field," airXiv: 1511.0|17601v1 [cond-mat.mes-hall] Nov. 5, 2015.
(Continued)

*Primary Examiner* — William B Partridge
*Assistant Examiner* — Felix B Andrews
(74) *Attorney, Agent, or Firm* — Jenkins, Taylor & Hunt, P.A.

(57) ABSTRACT

A quantum device is disclosed having an LC resonator circuit for performing qubit measurement or readout. The device comprises a silicon layer (601), a dielectric layer (603) disposed upon and forming a functional interface with the silicon layer (601), a first metallic region (614) disposed upon the dielectric layer 603, and a second metallic region (624) disposed upon the dielectric layer 603 and laterally separated from the first metallic region (614). The first and second metallic regions (614, 624) are arranged to be electrically connected such that a double quantum dot, forming a qubit having a first state and a second state, can be induced beneath the first and second metallic regions (614, 624) at the functional interface. The double quantum dot provides a capacitor C1 in the LC resonator circuit and the capacitance of the double quantum dot is dependent on
(Continued)

the state of the qubit. The first metallic region (614) provides an inductor L1 in the LC resonator circuit, and the resonant frequency of the LC resonator circuit is dependent on the state of the qubit such that the state of the qubit can be measured or inferred.

14 Claims, 11 Drawing Sheets

(52) U.S. Cl.
CPC .............. *H10N 60/01* (2023.02); *H10N 60/11* (2023.02); *H10N 60/128* (2023.02)

(56) References Cited

U.S. PATENT DOCUMENTS

| | | |
|---|---|---|
| 2020/0162078 A1 | 5/2020 | Mckay et al. |
| 2020/0403137 A1 | 12/2020 | Lampert et al. |
| 2021/0065036 A1 | 3/2021 | Sank |

OTHER PUBLICATIONS

International Search Report and Written Opinion for International Application No. PCT/EP2022/055531 dated Jun. 29, 2022.

Gonzalez-Zalba M. et al., "A hybrid double-dot in silicon," New Jour. of Physics, Institute of Physics Publishing, vol. 14, No. 2, Feb. 21, 2012.

Gorman J., et al., "Charge-Qubit Operation of an Isolated Double Quantum Dot," Physical Review Letters, vol. 95, No. 9, Aug. 1, 2005.

Hayashi et al., "Design and Fabrication of Microwave Kinetic Inductance Detectors using NbN Symmetric Spiral Resonator Array," Journal of Physics: Conference Series 507 (2014).

Schaal S. et al., "A CMOS dynamic random access architecture for radio-frequency readout of quantum devices," Cornell University Library, Sep. 11, 2018.

Shearrow et al., "Atomic layer deposition of titanium nitride for quantum circuits," APL 113 212601 Nov. 19, 2018.

Office Action for Taiwanese Patent Application Serial No. 111106486 (Jul. 2, 2025).

* cited by examiner

Dispose a dielectric layer upon a semiconductor layer to form a functional interface ~501

Dispose a first metallic region upon the dielectric layer ~502

Dispose a second metallic region upon the dielectric layer, laterally separate from the first metallic region ~503

COMPACT SILICON QUBIT CELL WITH EMBEDDED READOUT

CROSS-REFERENCE TO RELATED APPLICATIONS

This application is a national stage patent application under 35 U.S.C. § 371 of PCT Patent Application No. PCT/EP2022/055531, filed Mar. 4, 2022, which claims the benefit of and priority to European Patent Application No. 21161175.1, filed Mar. 8, 2021, the disclosures of each of which are incorporated herein by reference in their entireties.

FIELD OF THE INVENTION

The present invention relates to a quantum device including an LC resonator circuit. The device is suitable for performing qubit measurement or readout.

BACKGROUND TO THE INVENTION

Qubit processors in the near-term intermediate-scale quantum computing, or NISQ, era, may use 50-100 qubits. Qubits are typically arranged in dense arrays so as to minimise the necessary processor size.

A quantum computation using the qubit processor typically involves reading out the state of each of the qubits following the performance of a sequence of operations on the qubits. The readout can be performed by coupling a charge sensor to an LC resonator, or by embedding the qubit in an LC resonator circuit. However, the circuitry required to read out the state of a qubit occupies a very large area in comparison to the area required for the qubit itself. Typically, the area occupied by each qubit may be between $100 \times 100$ nm$^2$ and $1 \times 1$ µm$^2$, wherein the size is dependent on the properties of the materials used. In contrast, the area occupied by an LC resonator is typically at least $100 \times 100$ µm$^2$, which is several orders of magnitude larger than the qubit occupation area.

The relatively large area occupied by the LC resonator circuitry presents a significant limitation to the scalability of the technology. It is desirable to reduce the size of the readout circuitry.

SUMMARY OF THE INVENTION

An aspect of the invention provides a quantum device having an LC resonator circuit for performing qubit measurement or readout. The device comprises: a semiconductor layer; a dielectric layer disposed upon and forming a functional interface with the semiconductor layer; a first metallic region disposed upon the dielectric layer; and a second metallic region disposed upon the dielectric layer and laterally separated from the first metallic region. The first and second metallic regions are arranged to be electrically connected such that a double quantum dot, forming a qubit having a first state and a second state, can be induced beneath the first and second metallic regions at the functional interface. The double quantum dot provides a capacitor in the LC resonator circuit and the capacitance of the double quantum dot is dependent on the state of the qubit. The first metallic region provides an inductor in the LC resonator circuit. The resonant frequency of the LC resonator circuit is dependent on the state of the qubit such that the state of the qubit can be measured or inferred.

The first and second metallic regions are arranged to be electrically connected such that a double quantum dot can be induced beneath the first and second metallic regions at the functional interface. This is achieved by applying a bias potential to the first and second metallic regions, which modifies the electrical potential landscape in the vicinity of the first and second metallic regions to locally confine charge carriers. The interface between the semiconductor layer and the dielectric layer typically comprises a functional portion and a non-functional portion. When a bias potential is applied to the first and/or second metallic regions, the functional portion typically has a larger field effect with respect to the non-functional portion such that one or more charge carriers can be confined at the functional interface beneath the first and/or second metallic regions. The charge carriers may be electrons or holes depending on the polarity of the bias potential.

The first metallic region is arranged to be electrically connected such that a first quantum dot can be induced beneath the first metallic region at the functional interface. The second metallic region is similarly arranged to be electrically connected such that a second quantum dot can be induced beneath the second metallic region at the functional interface. The size of the first and second metallic regions affects the size of the first and second quantum dots and accordingly their electrical properties such as their charging energies. The charging energy is inversely proportional to the size of the quantum dot; a smaller metallic region can be used to induce a smaller quantum dot with a larger charging energy.

Optionally, a bias potential may be applied to either the first metallic region or the second metallic region to induce a single quantum dot. However, preferably a bias potential is applied to both the first and second metallic regions to induce a double quantum dot. The double quantum dot comprises the first quantum dot and the second quantum dot. The separation between the first and second metallic regions is such that the first and second quantum dots can be tunnel coupled.

The double quantum dot forms a qubit having a first state and a second state. For example, the first state may comprise electrons with anti-parallel spin orientations and the second state may comprise electrons with parallel spin orientations. In this example, the capacitance of the first state is higher than the capacitance of the second state as a result of the double quantum dot spin dynamics. If the electron spins are parallel, tunnelling between the first and second quantum dots is suppressed, or even zero, due to spin blockade.

The state of the qubit can be readout using an LC resonator circuit comprising an inductor and a capacitor. An LC resonator circuit may otherwise be known as an LC tank circuit, an LC resonator, a tank circuit or a resonant circuit. The LC resonator circuit has a resonant frequency, $\omega_0$, which depends on the inductance, L, and capacitance, C, according to the following equation:

$$\omega_0 = \frac{1}{\sqrt{LC}}.$$

At the resonant frequency, the forward power transmission is at a maximum. In the device described above, the double quantum dot provides a capacitor in the LC resonator circuit. The capacitance, and thus the resonant frequency, is dependent on the state of the qubit. Accordingly, the state of the qubit can be inferred.

In the quantum device described above, the first metallic region performs a dual function. Firstly, the first metallic region is arranged to be electrically connected such that a quantum dot can be induced beneath the first metallic region at the functional interface. Secondly, the first metallic region provides an inductor in the LC resonator circuit. Accordingly there is no requirement for an additional inductor. Preferably, only the first metallic region provides the inductor in the LC resonator circuit. The device thus advantageously provides a compact qubit readout mechanism to measure or infer the state of the qubit.

The semiconductor layer of the device may be any suitable semiconductor such as gallium arsenide (GaAs), indium arsenide (InAs), silicon germanium (SiGe), silicon carbide (SiC), carbon or silicon. Different allotropes of carbon may be used such as graphene or carbon nanotubes. Different forms of silicon may be used such as intrinsic silicon, isotoptically pure silicon $Si^{28}$, or doped silicon. The semiconductor layer optionally forms part of a layered substrate which further comprises an insulating layer beneath the semiconductor layer. The substrate may comprise additional layers beneath the insulating layer. In an example, the semiconductor layer is a silicon layer disposed upon a buried oxide which is further disposed upon a silicon substrate. Alternatively, there may be no insulating layer present beneath the semiconductor layer and the semiconductor layer may form part of a bulk semiconductor substrate.

The dielectric layer disposed upon and forming a functional interface with the semiconductor layer may be any suitable electrically insulating material such as silicon dioxide, aluminium oxide, undoped aluminium gallium arsenide (AlGaAs), or materials with a high dielectric constant, $\kappa$, such as hafnium silicate, zirconium silicate, hafnium dioxide and zirconium dioxide.

Preferably, the first metallic region comprises a high carrier mobility conductor such as a superconductor. For example, the first metallic region may comprise titanium nitride (TiN), niobium nitride (NbN) or niobium titanium nitride (NbTiN). These materials typically have a high kinetic inductance. The inductance of the first metallic region which provides an inductor in the LC resonator circuit is dependent on the material properties and the geometry of the first metallic region. The inductance of the first metallic region is typically between 10 and 100 nanohenries and preferably between 40 and 60 nanohenries. For example, the inductance of the first metallic region may be 50 nanohenries. The inductance is dependent on the geometry of the first metallic region. Advantageously, when the first metallic region comprises a material with a high kinetic inductance, the inductor can be made smaller, resulting in a more compact device.

The kinetic inductance of the first metallic region is dependent on its geometry. The kinetic inductance is inversely proportional to the thickness and the length of the first metallic region and proportional to the extension of the first metallic region. Accordingly, any of the following will increase the kinetic inductance of the first metallic region: a reduced thickness; a narrower region; or an increased extension.

Preferably, the thickness of the first metallic region is between 1 and 10 nanometres. A thinner first metallic region will have a higher kinetic inductance which advantageously results in a smaller area occupied by the first metallic region, leading to the realisation of a more compact device.

Superconducting materials such as those which may form part of the first metallic region have a critical temperature, below which the electrical resistivity of the material is zero, i.e. the material becomes superconducting. The superconductor may have a critical temperature below 70 Kelvin, preferably below 20 Kelvin and more preferably below 10 Kelvin. This has an advantage that superconductors with a lower critical temperature typically have a higher kinetic inductance. However, the critical temperature of the superconductor is not a limiting factor.

The first metallic region therefore provides an inductor in the LC resonator circuit of the quantum device at cryogenic temperatures, and the double quantum dot provides a capacitor in the LC resonator circuit. In order to measure or infer the state of the qubit, the device preferably further comprises a power source and a probe. The power source is typically configured to supply power at a frequency corresponding to a resonant frequency of the LC resonator circuit. The power source may be connected to the first metallic region. The probe may be connected to the first and/or second metallic region and is typically configured to measure the power transmission through the LC resonator circuit. The measurement of the power transmission through the LC resonator circuit can be used to infer the state of the qubit.

The measured power transmission may be, for example, the forward power transmission, $S_{21}$. In this example, the power source is connected to the first metallic region and the probe is connected to the second metallic region. $S_{21}$ is an S-parameter, or scattering parameter, used to determine the relationship between the first and second ports. At the resonant frequency of the LC resonator circuit, the forward power transmission is high. The resonant frequency of the LC resonator circuit is dependent on the state of the qubit.

In another example, the measured power transmission may be the reflected power transmission, $S_{11}$. In this example, the power source and the probe are connected to the first metallic region. $S_{11}$ is a further S-parameter which is dependent on the resonant frequency of the LC resonator circuit. At the resonant frequency of the LC resonator circuit, the reflected power transmission is low.

In a further example, the power source is connected to the first metallic region and a probe is connected to the first and second metallic regions. In this example, both the forward power transmission, $S_{21}$, and the reflected power transmission, $S_{11}$, can be measured.

Optionally, the power source is configured to supply power at the resonant frequency of the LC resonator circuit corresponding to the first state of the qubit. Accordingly, if the qubit is in the first state, the forward power transmission, $S_{21}$, will be high. If the qubit is in the second state, the forward power transmission will be low. Alternatively, the power source may be configured to supply power at the resonant frequency of the LC resonator circuit corresponding to the second state of the qubit. In this example, the forward power transmission will be high if the qubit is in the second state and low if the qubit is in the first state.

Optionally, the power source is configured to supply power at the resonant frequency of the LC resonator circuit corresponding to the first state of the qubit and the reflected power transmission, $S_{11}$, is used to infer the state of the qubit. If the qubit is in the first state, the reflected power transmission will be low. If the qubit is in the second state, the reflected power transmission will be high. The reflected power transmission spectrum includes an inverse peak at the resonant frequency. In another example, the power source is configured to supply power at the resonant frequency of the LC resonator circuit corresponding to the second state of the qubit and the reflected power transmission is used to infer the state of the qubit: the reflected power transmission will be low if the qubit is in the second state and high if the qubit is in the first state.

Advantageously, the device can be used to sensitively infer the state of the qubit based on the power transmission measurement. Furthermore, in comparison with the prior art, the device provides a significantly more compact qubit readout mechanism. The qubit unit cell, which comprises the first and second metallic regions which are suitable for supporting the double quantum dot qubit, may be approximately 100 nanometres by 10 micrometres. This is approximately 10,000 times smaller than existing devices with a similar function.

Typically, the LC resonator circuit has two resonant frequencies: a first resonant frequency corresponding to the first state of the qubit and a second resonant frequency corresponding to the second state of the qubit. Preferably, the resonant frequency at which the power source is configured to supply power is the lower frequency of the first and second resonant frequencies. An advantage of selecting a lower frequency is the reduction of parasitic losses.

The resonant frequency of the LC resonator circuit is determined by the inductors and capacitors in the circuit. Optionally, the first metallic region provides a first inductor in the LC resonator circuit and the second metallic region provides a second inductor in the LC resonator circuit. Preferably, only the first and second metallic regions provide inductors in the LC resonator circuit. Using this arrangement, there is no requirement for additional inductors to perform the qubit readout and thus the device can advantageously be more compact. The inclusion of first and second inductors provided by the first and second metallic regions advantageously provides additional flexibility over only having a first inductor provided by the first metallic region due to the fact that readout can be performed at either the first or second metallic regions. Furthermore, when both the first and second metallic regions provide inductors in the LC resonator circuit and the inductors are in series, the overall inductance of the circuit can be increased. This has the advantage that the device dimensions can be further reduced for a specific inductance.

If the second metallic region provides a second inductor in the LC resonator circuit, the second metallic region preferably has substantially the same features as the first metallic region. For example, the second metallic region preferably comprises a high carrier mobility conductor with a high kinetic inductance such as titanium nitride, niobium nitride or niobium titanium nitride. The second metallic region preferably has similar dimensions to that of the first metallic region. This has an advantage that it is easier to manufacture such a device.

The first and second metallic regions are laterally separated. The lateral separation provides electrical separation. Optionally, the dielectric layer disposed upon and forming a functional interface with the semiconductor layer is a first dielectric layer and the device further comprises a second dielectric layer, wherein the second dielectric layer is disposed at least upon the first and second metallic regions. The second dielectric layer may at least partially overly the edges of the first and second metallic regions. The portion of the second dielectric layer covering the first metallic region may be laterally separated from the portion of the second dielectric layer covering the second metallic region. Alternatively, the portion of the second dielectric layer covering the first metallic region may be connected to the portion of the second dielectric layer covering the second metallic region such that the gap between the first and second metallic regions is closed. The second dielectric layer may for example be silicon nitride, $Si_3N_4$, aluminium oxide, $Al_2O_3$, or silicon dioxide, $SiO_2$. The use of a second dielectric layer may advantageously improve the electrical separation of the first and second metallic regions and may also protect the first and second metallic regions from damage.

Optionally, the device further comprises a masking layer covering the first metallic region. The masking layer may be disposed upon the first metallic region. Optionally, the masking layer also covers the second metallic region. The masking layer may comprise polysilicon, aluminium, silicon oxide, silicon nitride, or aluminium oxide, for example. An advantage of including a masking layer is the protection of the first and second metallic regions. When the masking layer is disposed upon both the first metallic region and the second metallic region, the masking layer may protect the first and second metallic regions from mechanical and electrical damage which may occur during the device fabrication process and/or during operation of the device.

The fabrication of the device is preferably performed using a complementary-metal-oxide semiconductor manufacturing process. This advantageously facilitates the production of the device.

In an implementation of this aspect of the invention, the semiconductor layer comprises a nanowire. The nanowire may be fabricated by selectively etching the substrate to define a nanowire. Alternatively, in some examples the nanowire may be grown, for example carbon nanotubes can be grown. The first and second metallic regions may be disposed on opposing sides of the nanowire such that each of the first and second metallic regions partially overlaps one edge of the nanowire and respective portions of the first and second metallic regions extend away from the nanowire. The respective portions of the first and second metallic regions may extend in a direction that is substantially perpendicular to the nanowire. This may advantageously facilitate the fabrication process.

Alternatively, the respective portions of the first and second metallic regions may extend in a non-linear manner. The kinetic inductance of each metallic region is proportional to its extension and thus arranging the respective portions of the first and second metallic regions to extend in a non-linear manner such as a meander or curved, serpentine manner, has an advantage that the device may occupy a smaller area. In another example, the extension of the first and second metallic regions is at an angle with respect to the nanowire: the particular arrangement of the extension does not affect the electrical properties of the device. The dielectric layer is disposed upon the nanowire, providing an electrical separation between the semiconductor layer and the first and second metallic regions.

Preferably, the first and second metallic regions are positioned such that first and second quantum dots can be induced in the corners of the nanowire. The double quantum dot comprises the first and second quantum dots beneath the first and second metallic regions respectively. This arrangement, which may be referred to as a split-gate transistor, advantageously results in strong charge carrier confinement as a result of the geometry: the charge carriers are confined in two dimensions by the two sides of the nanowire forming a corner. The length of the extension of the first and second metallic regions is chosen according to the desired inductance. This arrangement has a further advantage that it may easily be scaled up. Preferably, if the metallic regions are arranged such that a one dimensional array of double quantum dot qubits can be supported along the nanowire, the extension of the metallic regions is non-linear or substantially perpendicular to the nanowire. This has the advantage that adjacent metallic regions can remain laterally, and electrically, separated and do not come into contact at any point. Furthermore such a configuration is advantageously easier to design and to fabricate.

In order to scale up the device, the device optionally further comprises third and fourth metallic regions disposed upon the dielectric layer. The third and fourth metallic regions correspond to the first and second metallic regions described above. The third and fourth metallic regions may be disposed on opposing sides of the nanowire such that each of the third and fourth metallic regions partially overlaps one edge of the nanowire and include respective portions that extend away from the nanowire (preferably in directions that are perpendicular to the nanowire). The third and fourth metallic regions are preferably laterally separated from the first and second metallic regions along the longitudinal axis of the nanowire. Typically, the first and second metallic regions are arranged to be electrically connected such that a first double quantum dot can be induced beneath the first and second metallic regions at the functional interface; and the third and fourth metallic regions are arranged to be electrically connected such that a second double quantum dot can be induced beneath the third and fourth metallic regions at the functional interface.

In this way, the device can be scaled in one dimension. Additional qubit unit cells, wherein each qubit unit cell comprises two metallic regions which are suitable for supporting a double quantum dot qubit, can be positioned at intervals along the nanowire. The intervals may be regular or irregular. The scalable architecture is advantageous and is in line with the research direction of quantum computing and quantum devices for qubit processing.

Optionally, the inductance of each of the third and fourth metallic regions is greater than the inductance of each of the first and second metallic regions. In order to achieve this, the third and fourth metallic regions may extend further and/or be narrower than the first and second regions. Alternatively the third and fourth metallic regions may be made thinner than the first and second regions, although this may be difficult to achieve in practice. Preferably, the third and fourth metallic regions extend further than the first and second metallic regions and have the same length. Optionally, the first and second metallic regions extend in a linear manner, substantially perpendicular to the nanowire, and the third and fourth metallic regions extend in a non-linear manner such that the third and fourth metallic regions do not occupy a region beyond the extension of the first and second metallic regions. In this way, the device can be beneficially made more compact.

The first double quantum dot forms a first qubit in a first qubit unit cell comprising the first and second metallic regions and forming a first LC resonator circuit. The second double quantum dot forms a second qubit in a second qubit unit cell comprising the third and fourth metallic regions and forming a second resonator circuit. An effect of a difference in inductance between the first and second metallic regions and the third and fourth metallic regions is that the resonant frequencies of the first and second LC resonator circuits are different. This provides an advantage that the state of the first qubit and the state of the second qubit can be measured or inferred simultaneously using frequency-domain multiplexing.

Typically, the device further comprises a source electrode and a drain electrode. For a device comprising a one-dimensional array of qubit unit cells, the source and drain electrodes are preferably arranged at first and second ends of the array respectively. For example, the one-dimensional array may have n qubit unit cells arranged sequentially from 1 to n along the longitudinal axis of a nanowire. In this case, the source electrode is preferably arranged closest to the first qubit unit cell and laterally separated along the longitudinal axis of the nanowire. Similarly, the drain electrode is preferably arranged closest to the n-th qubit unit cell and laterally separated along the longitudinal axis of the nanowire. This may also be the case for a device comprising a single qubit unit cell, i.e. n=1. Typically, the source and drain electrodes are arranged to be electrically connected such that a bias potential can be applied. Application of a bias potential to the source and/or drain electrodes can be used to modify the conductance of the semiconductor layer.

In another implementation of this aspect of the invention, the semiconductor layer comprises a nanowire and the first and second metallic regions are laterally separated along the longitudinal axis of the nanowire. Each of the first and second metallic regions may overly one edge or both edges of the nanowire. This has an advantage that it is easy to fabricate.

The first and second metallic regions typically extend substantially perpendicularly to the nanowire. Alternatively, the first and/or second metallic regions may extend at any angle without affecting the function of the device. In another example, the first and/or second metallic regions may extend in a non-linear manner such as a crenelated manner. The extension of the first and second metallic regions defines their inductance; the particular layout can be chosen according to design requirements without affecting the device function. For practical reasons it is advantageous that the extension of the first and second metallic regions is substantially perpendicular in order to easily arrange the first and second metallic regions such that there is no overlap between them.

Optionally, the major portion of the first metallic region extends on the same side of the nanowire as the major portion of the second metallic region. Alternatively, the major portions of the first and second metallic regions may extend on opposite sides of the nanowire. The device is typically designed so as to reduce the total area.

In this implementation, the source electrode is preferably arranged closer to the first metallic region and laterally separated along the longitudinal axis of the nanowire. The drain electrode is preferably arranged closer to the second metallic region and laterally separated along the longitudinal axis of the nanowire.

In a further implementation of an aspect of this invention, the dielectric layer comprises a thin region and a thick region. The dielectric layer may comprise one or more thin regions and one or more thick regions. The thin and thick regions may be connected such that the dielectric layer is a continuous layer of non-uniform thickness. The thickness of the dielectric layer in the thin region(s) is typically at least half of the thickness of the dielectric layer in the thick region(s). The thin region(s) may have a thickness between 1 and 10 nanometres. The thick region(s) of the dielectric layer electrically isolate the first and second metallic regions from the semiconductor layer. The functional interface is formed between the semiconductor layer and the thin region (s) of the dielectric layer. Accordingly, confinement regions can be induced beneath the thin region(s) of the dielectric layer when a bias potential is applied to the first and/or second metallic regions. This has an advantage that the device can be implemented in bulk technologies.

The first metallic region typically overlies a thin region of the dielectric layer and a thick region of the dielectric layer.

When a bias is applied to the first metallic region, one or more charge carriers can be confined beneath the thin region, and not the thick region, of the dielectric layer due to the reduction of the field effect beneath the thick region of the dielectric layer. The second metallic region also typically overlies a thin and thick region of the dielectric layer.

The device may comprise a substantially rectangular thin region of the dielectric layer surrounded by a thick region of the dielectric layer. The rectangular thin region typically comprises a first edge and a second edge separated by 30 to 200 nanometres, or preferably separated by 30 to 150 nanometres, and may extend by several micrometres. Optionally, the first and second metallic regions are disposed on the first and second edges of the rectangular thin region respectively, such that each of the first and second metallic regions partially overlaps one edge of the rectangular thin region and includes respective portions that extend away from the thin region overlying the thick region. Typically, first and second quantum dots can be induced at the edges of the rectangular thin region of the dielectric layer beneath the first and second metallic regions respectively.

The layout of the extending portions of the first and second metallic regions overlying the thick region can be linear or non-linear. The layout is typically arranged to reduce the area occupied by the first and second metallic regions. The layout is preferably arranged to facilitate the fabrication process.

The device optionally further comprises third and fourth metallic regions disposed upon the dielectric layer. The third and fourth metallic regions may be disposed on the first and second edges of the rectangular thin region respectively, such that each of the third and fourth metallic regions partially overlaps one edge of the rectangular thin region and includes respective portions that extend away from the thin region. The respective portions overly the thick region. The third and fourth metallic regions are preferably laterally separated from the first and second metallic regions along the longitudinal axis of the rectangular thin region.

The first and second metallic regions are arranged to be electrically connected such that a first double quantum dot can be induced beneath the first and second metallic regions at the functional interface. The third and fourth metallic regions are arranged to be electrically connected such that a second double quantum dot can be induced beneath the third and fourth metallic regions at the functional interface. The functional interface is typically formed between the semiconductor layer and the thin region of the dielectric layer. Optionally, the inductance of each of the third and fourth metallic regions is greater than the inductance of each of the first and second metallic regions.

In another example, the first and second metallic regions are laterally separated along the longitudinal axis of the rectangular thin region of the dielectric layer. Typically, first and second quantum dots can be induced beneath the first and second metallic regions at the interface between the thin dielectric layer and the semiconductor layer: this interface is referred to as the functional interface. In this example, the first and second quantum dots may be formed substantially centrally in the rectangular thin region of the dielectric layer.

Another aspect of the invention provides a method for performing qubit measurement or readout using the quantum device described above. The method comprises the steps of: applying first and second bias potentials to the first and second metallic regions respectively to induce a double quantum dot, forming a qubit having a first state and a second state, beneath the first and second metallic regions at the functional interface; applying a signal to the first metallic region with a selected frequency; applying a bias difference between the first and second metallic regions; and measuring the power transmission at the first or second metallic region, wherein the measurement is used to measure or infer the state of the qubit.

In this method, the first and second metallic regions are used both to induce a double quantum dot and to measure or infer the state of the qubit. The first metallic region is preferably the only inductor in the LC resonator circuit used for performing qubit measurement or readout. As a result of the dual function, the area occupied by the device can advantageously be reduced. In some implementations, the second metallic region provides an additional inductor in the LC resonator circuit.

Optionally the first and second bias potentials can be the same, and may for example be applied using a single source. However, the first and second metallic regions are electrically separate regions.

The double quantum dot forms a qubit having a first state and a second state. The qubit has a capacitance which is dependent on the state of the qubit. The qubit forms a capacitor in an LC resonator circuit, and the first metallic region provides an inductor in the LC resonator circuit. The resonant frequency of the LC resonator circuit is dependent on the state of the qubit. At the resonant frequency of the LC resonator circuit, the forward power transmission is at a maximum and the reflected power transmission is at a minimum.

The selected frequency applied to the first metallic region preferably corresponds to a resonant frequency of the LC resonator circuit. Typically, the selected frequency is the resonant frequency of the LC resonator circuit when the capacitance of the double quantum dot is maximum. This may correspond, for example, to the first state of the qubit. A larger capacitance results in a lower resonant frequency. Application of a signal having a lower frequency has an advantage that it typically results in lower parasitic losses.

The measured power transmission may be the forward power transmission, $S_{21}$, or the reflected power transmission, $S_{11}$. Preferably, if the measured power transmission is the forward power transmission, the method comprises measuring the forward power transmission at the second metallic region. Preferably, if the measured power transmission is the reflected power transmission, the method comprises measuring the reflected power transmission at the first metallic region.

In an example, the frequency of the signal corresponds to the resonant frequency of the LC resonator circuit when the qubit is in the first state. In this example, if the qubit is in the first state, the forward power transmission, $S_{21}$, will be high and the reflected power transmission, $S_{11}$, will be low. Conversely, if the qubit is in the second state, the forward power transmission will be low and the reflected power transmission will be high. In this way, measurement of the power transmission at the first or second metallic region can be used to measure or infer the state of the qubit.

The method described includes the measurement of one qubit. If the device comprises additional qubits, the method may further involve a multiplexing method in order to read out the state of multiple qubits. In a device with multiple qubits, the method may comprise: applying first and second bias potentials to the first and second metallic regions respectively to induce a first double quantum dot, forming a first qubit; and applying third and fourth bias potentials to third and fourth metallic regions respectively to induce a second double quantum dot, forming a second qubit.

Optionally, the method comprises time-domain multiplexing. At a first time, $t_0$, the method may comprise applying a signal to the first metallic region with a first selected frequency. At a second time, $t_1$, which is later than the first time, $t_1 > t_0$, the method may comprise applying a signal to the third metallic region with a second selected frequency. The second selected frequency may be the same as the first selected frequency. The measurement of the power transmission at the second and fourth metallic regions respectively is performed sequentially to infer the state of the first and second qubit. An advantage of performing time-domain multiplexing is the scalability of both the device and the technique.

Optionally, as an alternative to, or in combination with, time-domain multiplexing, the method comprises frequency-domain multiplexing. In order to perform frequency-domain multiplexing, the inductance of the first and/or second metallic region differs from the inductance of the third and/or fourth metallic region. Consequently, the resonant frequencies of the respective LC resonator circuits are different, and a measurement of the power transmission across a range of frequencies can be used to measure or infer the state of the first qubit and the second qubit simultaneously. An advantage of performing frequency-domain multiplexing is the increased processing speed due to simultaneous readout of multiple qubits.

Preferably the method is performed at a temperature below 20 Kelvin, and more preferably at a temperature below 10 Kelvin. Advantageously, at cryogenic temperatures the effect of thermal excitations on the occupation of the double quantum dot is reduced. Furthermore, the first metallic region may comprise a superconductor which is superconducting below a critical temperature, $T_c$. The critical temperature is dependent on the material but is typically a low temperature. Accordingly, when the temperature of the first metallic region is at cryogenic temperatures, the first metallic region is typically superconducting. Advantageously, the first metallic region is thus suitable for use as an inductor at cryogenic temperatures.

A further aspect of the invention provides a method of assembling a quantum device described above. The method comprises the steps of: disposing a dielectric layer upon a semiconductor layer to form a functional interface; and disposing a first metallic region upon the dielectric layer; and disposing a second metallic region upon the dielectric layer, laterally separate from the first metallic region. The first and second metallic regions are configured to be electrically connected such that a double quantum dot, forming a qubit having a first state and a second state, can be induced beneath the first and second metallic regions at the functional interface. The double quantum dot provides a capacitor in the LC resonator circuit and the capacitance of the double quantum dot is dependent on the state of the qubit. The first metallic region provides an inductor in the LC resonator circuit. The resonant frequency of the LC resonator circuit is dependent on the state of the qubit such that the state of the qubit can be measured or inferred.

Preferably, the first metallic region provides the only inductor in the LC resonator circuit. This method of assembling a quantum device advantageously results in a compact device suitable for qubit readout.

Optionally, the disposal of the first metallic region is performed in a different processing step relative to the disposal of the second metallic region. In this way the first and second metallic regions may be formed from different materials, such as titanium nitride and polysilicon respectively.

Alternatively, the first and second metallic regions are disposed upon the dielectric layer in the same processing step. This has an advantage that it can simplify the fabrication process. In this case, the first and second metallic regions are typically made from the same material, such as niobium nitride or another material with a high kinetic inductance.

The method may further comprise disposing a masking layer upon the first metallic region. Optionally the method also comprises disposing a masking layer upon the second metallic region. When the first and second metallic regions are covered in a masking layer, they are advantageously protected from damage. Potential damage may be caused by additional processing steps.

For example, the device typically includes source and drain electrodes. The method of assembling the device optionally includes performing a self-alignment implantation process to define the source and drain ohmic contacts. During this process, the first and second metallic layers may be subject to damage unless they are covered.

Aspects of the invention advantageously provide a compact device layout in which the qubit readout mechanism is embedded within the metallic regions of the device. The first metallic region provides a dual function in that it can be used to induce a quantum dot and can be used as an inductor in the LC resonator circuitry used to infer the state of the qubit: this advantageously reduces the size of the circuitry required to support and read out a qubit by four orders of magnitude in comparison with existing devices. The circuitry for supporting and reading out a qubit may occupy an area of approximately 100 nanometres by 10 micrometres. Furthermore, aspects of the invention are suitable for integration into a scalable device architecture which is suitable for processing a plurality of qubits.

BRIEF DESCRIPTION OF THE DRAWINGS

Embodiments of the invention will now be described with reference to the accompanying drawings in which.

DETAILED DESCRIPTION

Figure 1A:
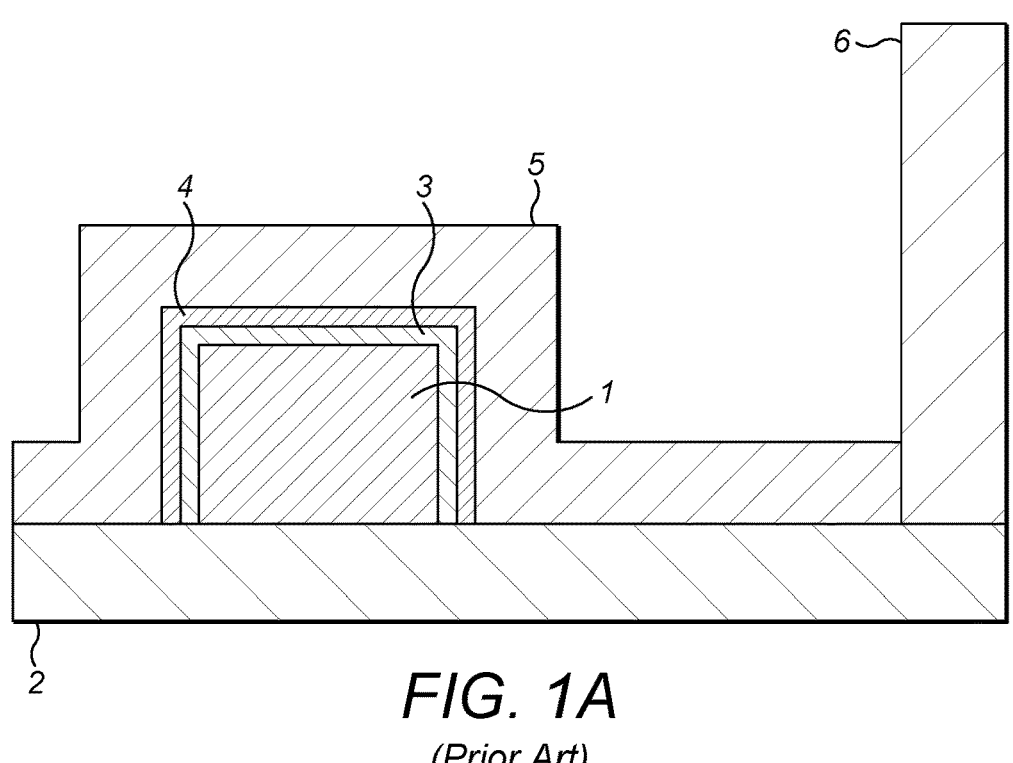
FIG. 1A is a cross-sectional side view of a prior art quantum device.
Figure 1B:
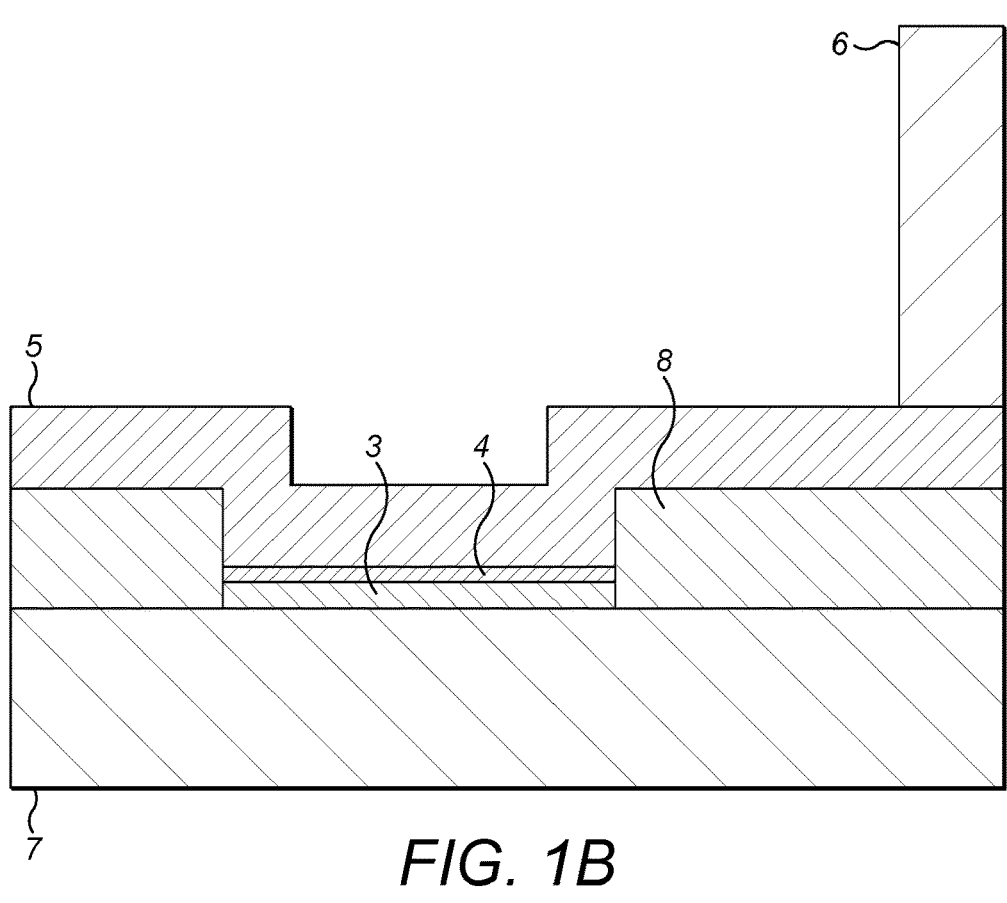
FIG. 1B is a cross-sectional side view of a prior art quantum device.

FIGS. 1A and 1B schematically illustrate cross-sectional side views of prior art quantum devices. The device shown in FIG. 1A is an exemplary nanowire transistor. The nanowire transistor comprises a silicon nanowire 1 disposed on a layer of silicon dioxide 2. The silicon dioxide layer 2 forms part of the substrate which further comprises a layer of silicon (not shown). A dielectric layer 3 comprising silicon dioxide covers the silicon nanowire 1. A layer of titanium nitride 4 covers the dielectric layer 3. The thickness of the titanium nitride layer 4 is approximately 5 nanometres. A layer of polysilicon 5 covers the layer of titanium nitride 4. The polysilicon layer 5 is conductive and extends from the silicon nanowire 1 to a gate electrode 6. The gate electrode 6 is connected to a power source (not shown) which can be used to apply a bias potential to the conductive polysilicon layer 5. In this way, one or more charge carriers may be confined in the silicon nanowire 1 to form a quantum dot.

The device shown in FIG. 1B is an exemplary planar transistor. The planar transistor comprises a silicon layer 7 and a silicon dioxide layer 8 partially covering the silicon layer 7. The device comprises a dielectric layer 3 which is deposited on the silicon layer 7 in a gap in the silicon dioxide layer 8. The dielectric layer 3 in this example is silicon dioxide. In another prior art example, a silicon dioxide layer is deposited on the silicon layer and the silicon dioxide layer is of varying thickness. The device shown in FIG. 1B further includes a titanium nitride layer 4 and a polysilicon layer 5 connected to a gate electrode 6 as shown in FIG. 1A. The titanium nitride layer 4 covers the dielectric layer 3 and the polysilicon layer 5 covers the titanium layer 4. The polysilicon layer 5 extends away from the dielectric layer 3 towards the gate electrode 6. Using this device, one or more charge carriers can be confined beneath the dielectric layer 3 (or beneath a thin region of the variable thickness silicon dioxide layer) when a bias potential is applied to the conductive polysilicon layer 5. The one or more charge carriers may be confined in a quantum dot.

In FIGS. 1A and 1B, the titanium nitride layer 4 can be used for threshold voltage engineering. Threshold voltage engineering is a technique used to offset the threshold voltage such that the operational value of the qubit can be set to a suitable value. In alternative prior art examples, the thickness of the titanium nitride layer may vary but is typically between 1 and 10 nanometres. Titanium nitride is a material with a high kinetic inductance. The inductance of the titanium nitride layer 4 depends on the geometry but is typically less than 1 nanohenry in existing quantum devices.

Figure 2A:
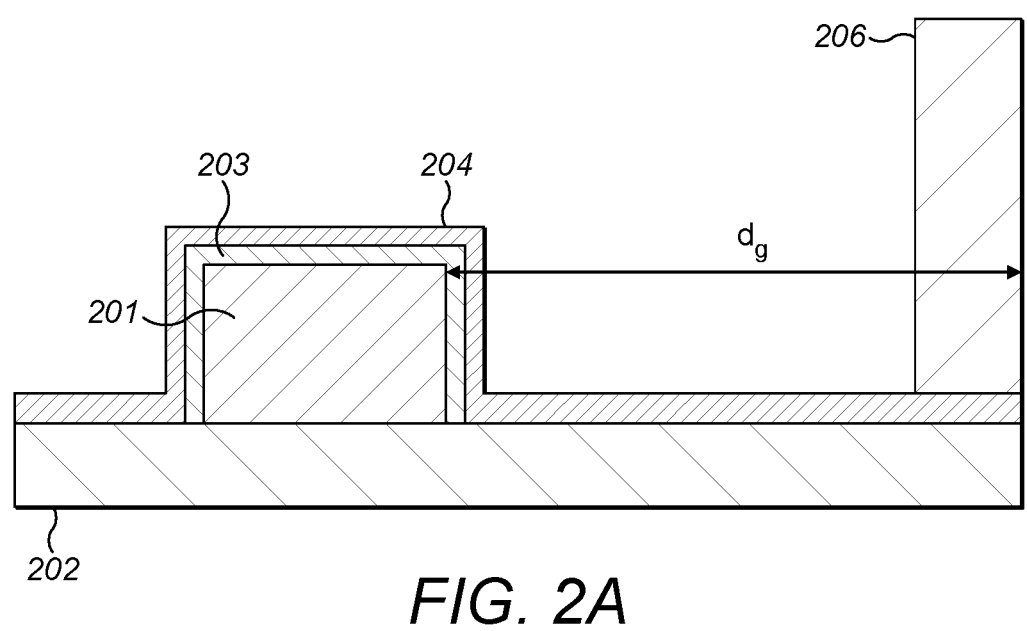
FIG. 2A is a cross-sectional side view of a quantum device.
Figure 2B:
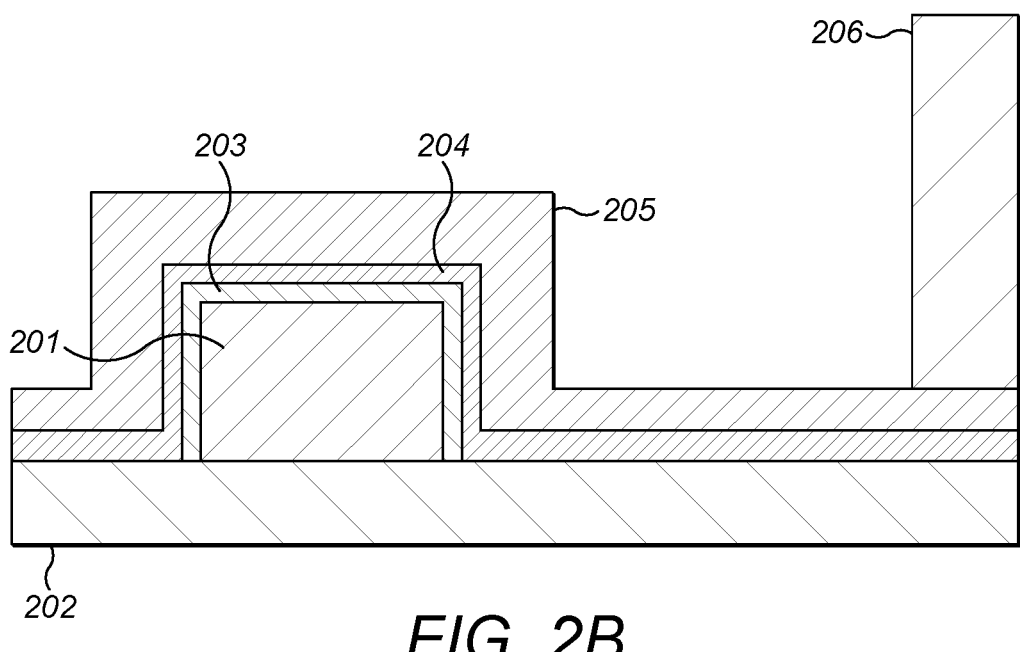
FIG. 2B is a cross-sectional side view of a quantum device.

FIGS. 2A and 2B schematically illustrate cross-sectional side views of quantum devices according to embodiments of the invention.

The device shown in FIG. 2A illustrates a semiconductor layer 201 disposed on a thick dielectric layer 202. In this example the semiconductor layer 201 comprises silicon and the thick dielectric layer 202 comprises silicon dioxide, $SiO_2$. In alternative examples the semiconductor layer 201 may be any suitable semiconductor such as GaAs, InAs, SiGe, graphene, carbon nanotubes or SiC; and the thick dielectric layer 202 may be any suitable electrically insulating layer such as silicon oxide, silicon nitride or aluminium oxide. The thick dielectric layer 202 forms part of a substrate which comprises a further supporting layer (not shown), which is made of silicon in this example, beneath the thick dielectric layer 202. In an alternative example there is no thick dielectric layer present and the semiconductor layer forms part of the substrate.

The silicon layer 201 in FIG. 2A comprises a silicon nanowire, which extends into the page as shown in FIG. 2A. A thin dielectric layer 203 is disposed upon the silicon layer 201. The thin dielectric layer 203 covers the exposed sides of the silicon layer 201 and comprises thermally grown silicon dioxide, $SiO_2$. A metallic region 204 is disposed upon the thin dielectric layer 203. The thin dielectric layer 203 provides an electrostatic barrier between the silicon layer 201 and the metallic region 204.

The metallic region 204 comprises titanium nitride, TiN. In alternative examples the metallic region may comprise niobium nitride or niobium titanium nitride. TiN is a superconducting material with a high kinetic inductance. For example, the kinetic inductance of a thin film of TiN can be in excess of 200 picohenries per square for a film thickness of 10 nanometres. The inductance of the metallic region 204 is dependent on its dimensions. The inductance is proportional to the extension of the metallic region 204 and inversely proportional to the length of the metallic region 204. Accordingly, the kinetic inductance is proportional to the ratio of the extension to the length of the metallic region 204. For a TiN thin film having a fixed thickness of 10 nanometres, the inductance of a region having equal length and extension will be in excess of 200 picohenries. The high kinetic inductance of TiN means the metallic region can be relatively small but provide an inductor with a high inductance. In this example the metallic region 204 is 20 nanometres thick. The inductance is inversely proportional to the thickness and therefore in another example, the inductance may be increased by reducing the thickness of the metallic region.

The length of the metallic region 204 is measured along the longitudinal axis of the nanowire and in this example is 22 nanometres, although this cannot be seen in the cross-sectional view. The metallic region 204 is electrically connected such that a quantum dot can be induced beneath the metallic region 204 at the functional interface between the semiconductor layer 201 and the thin dielectric layer 203 in the nanowire. The length of the metallic region 204 affects the size, and thus the properties such as the charging energy, of the quantum dot. The inductance is inversely proportional to the length of the metallic region 204. In another example, the size of the quantum dot may be increased by increasing the length of the metallic region; this would result in the quantum dot having a lower charging energy and the metallic region having a reduced inductance.

The metallic region 204 extends in a first direction which is substantially perpendicular to the nanowire. In an alternative example, the metallic region extends from the nanowire to form an acute angle between the metallic region and the nanowire. The metallic region 204 extends to come into contact with a gate electrode 206. The extension of the metallic region 204 is the separation, $d_g$, between the gate electrode 206 and the silicon layer 201 as measured along the first direction. The inductance is defined by the length that the current travels along from the gate electrode 206 to the silicon layer 201; the inductance of the metallic region 204 is proportional to its extension. Accordingly, in order to achieve an inductance of 50 nanohenries in this example, the extension of the metallic region 204 is approximately 10.6 micrometres. In another example, the extension of the metallic region may be increased to increase the inductance.

The metallic region 204 may alternatively extend in a non-linear manner. For example, the metallic region 204 may meander across the surface of the thick dielectric layer 202. Consequently, in this example the furthest point of the metallic region 204 is less than $d_g$, although the extension of the metallic region is $d_g$. This can be used to design a more compact device architecture.

The device shown in FIG. 2B has the same structural features as the device shown in FIG. 2A. However, in FIG. 2B the semiconductor layer 201 comprises gallium arsenide, GaAs, and the thin dielectric layer 203 comprises a thermally grown oxide. The supporting layer (not shown) comprises GaAs and the thick dielectric layer 202 comprises silicon dioxide, silicon nitride or aluminium oxide. In addition, the device in FIG. 2B further comprises a masking layer 205. The masking layer 205 covers the metallic region 204. In this example, the masking layer 205 comprises polysilicon. Alternatively, the masking layer may comprise aluminium, for example. The masking layer 205 is used to prevent damage to the metallic layer 204. The masking layer 205 shown in FIG. 2B is positioned in between the metallic layer 204 and the gate electrode 206. The masking layer 205 is conductive such that the metallic layer 204 is electrically connected to the gate electrode 206.

Figure 3A:
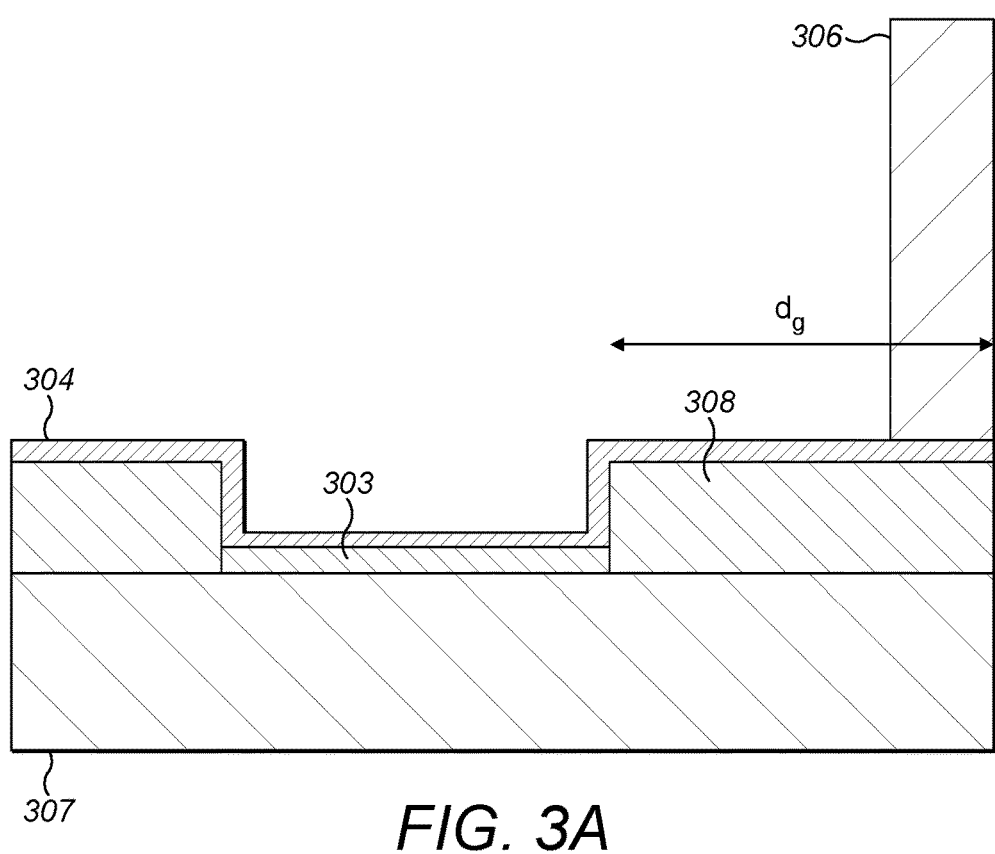
FIG. 3A is a cross-sectional side view of a quantum device.
Figure 3B:
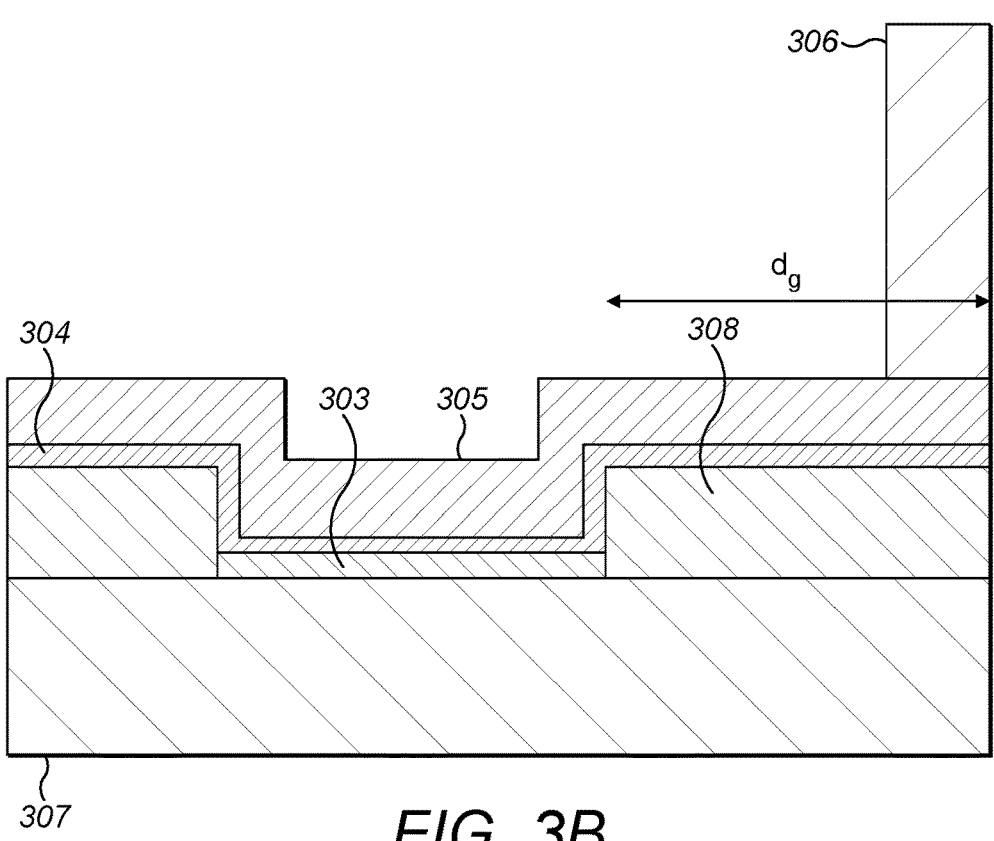
FIG. 3B is a cross-sectional side view of a quantum device.

FIGS. 3A and 3B schematically illustrate cross-sectional side views of quantum devices according to embodiments of the invention. The device substrate in FIG. 3A comprises a semiconductor layer 307 comprising indium arsenide, InAs. In alternative examples, any semiconducting material compatible with complementary-metal-oxide semiconductor manufacturing processes may be used. A thick dielectric layer 308 partially covers the semiconductor layer 307. This can be achieved by selectively depositing the thick dielectric layer 308 upon the semiconductor layer 307 such that gaps remain. Alternatively, in a first processing step the thick dielectric layer 308 may be deposited to fully cover the semiconductor layer 307 and in a second processing step, portions of the thick dielectric layer 308 may be removed to form gaps. The thick dielectric layer 308 comprises aluminium oxide, $Al_2O_3$, in this example. In an alternative example, the thick dielectric layer comprises silicon dioxide or silicon nitride.

A thin dielectric layer 303 comprising aluminium oxide is disposed upon the semiconductor layer 307. In another example, the thin dielectric layer comprises hafnium dioxide or any other material with a high dielectric constant. The thin dielectric layer 303 and thick dielectric layer 308 in this example are deposited in separate processing steps. Alternatively the thin dielectric layer 303 may be formed by selectively removing portions of the thick dielectric layer 308 using chemical or physical processes to form regions of thin dielectric layer 303.

Similarly to FIGS. 2A and 2B, a metallic region 304 is disposed on the thin dielectric layer 303. In FIGS. 3A and 3B, the metallic region 304 comprises niobium nitride, NbN. NbN is a material with a high kinetic inductance. In alternative examples the metallic region 304 may comprise titanium nitride or niobium titanium nitride. The metallic region 304 extends along the thick dielectric layer 308 to come into electrical contact with a gate electrode 306. In FIGS. 3A and 3B, the application of a bias potential to the gate electrode 306 can induce a quantum dot beneath the metallic region 304 at the functional interface between the semiconductor layer 307 and the thin dielectric layer 303.

The device shown in FIG. 3B has the same structural features as the device shown in FIG. 3A and further includes a masking layer 305. The masking layer 305 comprises aluminium and is disposed upon the metallic region 304. In another example, the masking layer comprises any conductive material such as polysilicon. In FIG. 3B, the semiconductor layer 307 comprises bilayer graphene. The thick dielectric layer 308 comprises aluminium dioxide which is selectively deposited on the semiconductor layer 307. The thin dielectric layer 303 comprises graphene oxide which is deposited or grown following the deposition of the thick dielectric layer 308. The semiconductor layer 307 is supported on a substrate such as a silicon substrate. In an alternative example, the thin dielectric layer comprises aluminium oxide or silicon oxide, which may be deposited using a suitable technique such as chemical vapour deposition (CVD).

Figure 4B:
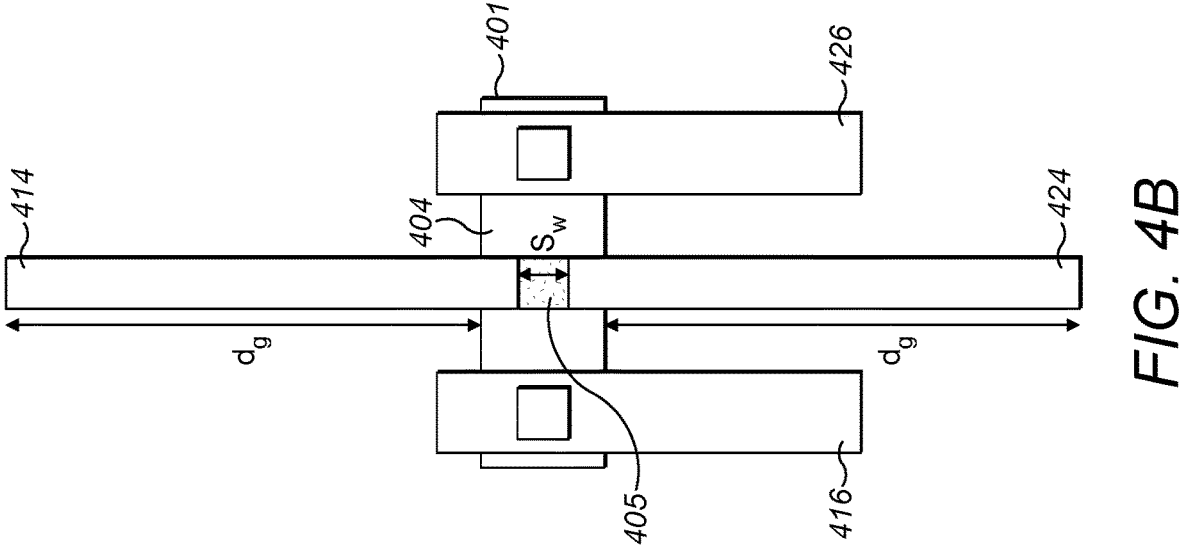
FIG. 4B is a plan view of a quantum device.
Figure 4A:
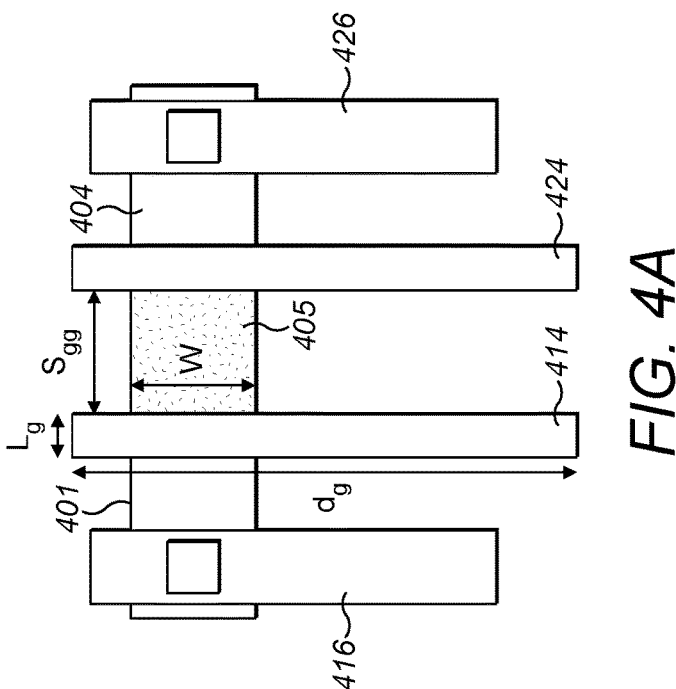
FIG. 4A is a plan view of a quantum device.

FIGS. 4A and 4B schematically illustrate plan views of quantum devices according to embodiments of the invention. The devices each comprise a transistor comprising a source electrode 416 and a drain electrode 426 which are electrically connected to a nanowire 401. In this example the nanowire comprises silicon. In an alternative example, the nanowire comprises gallium arsenide, a single-wall or multiwall carbon nanotube, silicon germanium, indium arsenide, graphene or silicon carbide. The source and drain electrodes 416, 426 are electrically connected to a voltage source. Application of a bias difference between the source and drain electrodes 416, 426 can be used to modify the electrical properties of the silicon nanowire 401. The nanowire 401 includes highly-doped regions 404 and an undoped region 405.

The devices each further comprise a first metallic region 414 and a second metallic region 424 which is laterally separated from the first metallic region 414. The undoped region 405 of the nanowire 401 extends beneath the first and second metallic regions 414, 424 to the edges of the nanowire 401. The nanowire 401 is electrically separated from the first and second metallic regions 414, 424 by a thin dielectric layer (not shown). The first metallic region provides a first inductor in an LC resonator circuit and the second metallic region provides a second inductor in the LC resonator circuit. The first and second metallic regions provide the only inductors in the LC resonator circuit. There are no additional on-chip or off-chip inductors. The first and second metallic regions 414, 424 are electrically separated from the nanowire 401 by a thin dielectric layer (not shown) positioned at least between the first and second metallic layers 414, 424 and the nanowire 401. In alternative examples, the thin dielectric layer may cover a major portion of the nanowire, or may only be disposed beneath the first and second metallic layers. The thin dielectric layer in this example is a thermally grown native oxide.

The first and second metallic regions 414, 424 are electrically connected to respective gate electrodes (not shown) which are connected to an external voltage source. The voltage source can be used to apply a voltage to the first and second metallic regions 414, 424 such that a double quantum dot can be induced beneath the first and second metallic regions 414, 424 at the functional interface. The functional interface is defined by the device geometry and electrical properties of the layers within the device. In this example, the nanowire is provided overlying a thick dielectric layer which is supported by a further supporting layer comprising silicon. The functional interface is between the outer surfaces of the nanowire and the thin dielectric layer overlying the nanowire. The thick dielectric layer beneath the nanowire reduces the field effect away from the nanowire. The double quantum dot induced at the functional interface forms a qubit having two states, and has a variable capacitance which varies according to the state of the qubit. The double quantum dot provides a capacitor in the LC resonator circuit of the device which can be used to measure or infer the state of the qubit.

In FIG. 4A, the first and second metallic regions 414, 424 are separated along the longitudinal axis of the nanowire 401. In an alternative example, the nanowire 401 is replaced with a carbon nanotube which has been grown and selected for its semiconducting properties. The separation, $S_{gg}$, between the first and second metallic regions 414, 424 is typically between 10 and 100 nanometres. The separation, $S_{gg}$, is configured to be large enough that first and second quantum dots formed beneath the first and second metallic regions 414, 424 upon application of a bias potential can be distinguished. On the other hand, the separation, $S_{gg}$, is configured to be small enough that the first and second quantum dots can be tunnel coupled to form a double quantum dot qubit.

Each of the first and second metallic regions 414, 424 have a length, $L_g$, and an extension, $d_g$. Typically the length and extension of the first metallic region are the same as that of the second metallic region. However, this is not a requirement; the dimensions of the metallic regions can be chosen according to the desired device performance characteristics. The inductance of the first and second metallic regions 414, 424 is proportional to the extension and inversely proportional to the length. The kinetic inductance per unit length, $L_K$, is determined by the following equation:

$$L_K = \frac{\mu_0 \lambda^2}{L_g t_g}$$

in which $\mu_0$ is magnetic permeability of vacuum, $\lambda$ is the London penetration depth, and $L_g$ and $t_g$ are the length and thickness of the metallic region. Typically, the length, $L_g$, is between 7 and 100 nanometres and the extension, $d_g$, is between 1 and 100 nanometres. The thickness, $t_g$, of the first and second metallic regions is typically between 1 and 20 nanometres. A thicker metallic region has a lower inductance per square and will therefore occupy a larger area. However, fabrication of a thinner metallic region may result in a lower yield due to fabrication difficulties. In an example, the metallic region comprises TiN and is 40 nanometres long and 10 nanometres thick. In this example, the inductance is 5 nanohenries per micron that the metallic region extends.

In FIG. 4A, the first and second metallic regions 414, 424 are positioned to overly both edges of the nanowire 401. Application of a bias potential to the first and second metallic regions 414, 424 can induce first and second quantum dots beneath the first and second metallic regions respectively in the nanowire 401. Each of the first and second quantum dots are positioned substantially centrally in the nanowire, away from the edges. The confinement of charge carriers in each of the first and second quantum dots is achieved using the narrow width, w, of the nanowire 401, the length of the respective metallic region, $L_g$, and the functional interface between the nanowire 401 and the thin dielectric layer (not shown). The width, w, of the nanowire 401 is typically between 30 and 140 nanometres. Preferably, w is less than 100 nanometres. In this example, the width, w, of the silicon nanowire 401 is approximately 60 nanometres. The narrower the nanowire, the stronger the confinement. The appropriate width of the nanowire will depend on the properties of the semiconductor used in the device, such as the effective mass of the charge carriers.

In an alternative example, the first and second metallic regions are positioned to overly only one edge of the nanowire and the first and second metallic regions each overly the same edge of the nanowire. The first and second metallic regions are laterally separated along the longitudinal axis of the nanowire. In this alternative example, the confinement of charge carriers is achieved using the corner of the nanowire and the length of the metallic region, $L_g$. The width, w, of the nanowire is irrelevant in this alternative example and can be several micrometres or more.

In FIG. 4B, the first and second metallic regions 414, 424 are positioned on opposing sides of the nanowire 401. Each of the first and second metallic regions 414, 424 partially overlaps one edge of the nanowire 401. The first and second metallic regions 414, 424 are separated along the width of the nanowire 401 by a separation $S_{vv}$. The separation, $S_{vv}$, is typically between 10 and 100 nanometres. The separation, $S_{vv}$, is configured to be large enough that first and second quantum dots formed beneath the first and second metallic regions 414, 424 upon application of a bias potential can be distinguished. On the other hand, the separation, $S_{vv}$, is configured to be small enough that the first and second quantum dots can be tunnel coupled to form a double quantum dot qubit.

The capacitance of the device is dependent on the device geometry and the state of the qubit. The total capacitance is made up of a variable capacitance arising from the double quantum dot qubit, a geometric capacitance, and parasitic capacitances. The resonant frequency of the LC resonator circuit is dependent on the capacitance.

The double quantum dot qubit has a first state with a first capacitance and a second state with a second capacitance. The first and second capacitance values are different. In this example, the spin orientation of the electrons is antiparallel in the first state of the qubit and is parallel in the second state of the qubit. In the first state, tunnelling is possible between the first and second quantum dots. In the second state, tunnelling is suppressed due to spin blockade. Accordingly, the first capacitance is much larger than the second capacitance. The first capacitance may be in the femtofarad range and will depend on the qubit properties.

The geometrical capacitance can be estimated using the following equation $$C_{geom} \sim \varepsilon_{die} \frac{L_g t_g}{S_{vv}}$$

wherein $\varepsilon_{die}$ is the dielectric constant of the thin dielectric layer, $L_g$ and $t_g$ are the length and thickness of the metallic region respectively, and $S_{vv}$ is the separation between the first and second metallic regions perpendicular to the longitudinal axis of the nanowire. Using exemplary values of $L_g$=50 nanometres; $t_g$=10 nanometres; and $S_{vv}$=10 nanometres, the geometric capacitance is approximately 2 attofarads for a device using a silicon dioxide thin dielectric layer. This is much smaller than the first capacitance.

Parasitic capacitances may arise between any metallic regions and the electric ground state. However, the parasitic capacitances are typically small, for example approximately 0.1-0.2 femtofarads. The value of parasitic capacitance is typically quoted by the manufacturer and can be incorporated into calculations to optimise the qubit measurement parameters. A change in capacitance has an effect on the resonant frequency of the LC resonator circuit and therefore should be taken into account when performing measurements.

In another example, the device comprises an additional dielectric layer covering the first and second metallic layers, and optionally fully or partially occupying the gap between the first and second metallic layers. The additional dielectric layer may be made of silicon nitride, $Si_3N_4$, and is used to ensure the electrical separation between nearby metallic regions and provide protection against electrical and/or physical damage. The additional dielectric layer may also be made of any electrically insulating material.

In a further example, the first metallic region 414 comprises TiN and the second metallic region 424 comprises polysilicon. In this example, the first metallic region 414 provides an inductor in the LC resonator. However, the second metallic region 424 does not contribute to the inductance.

Figure 5:
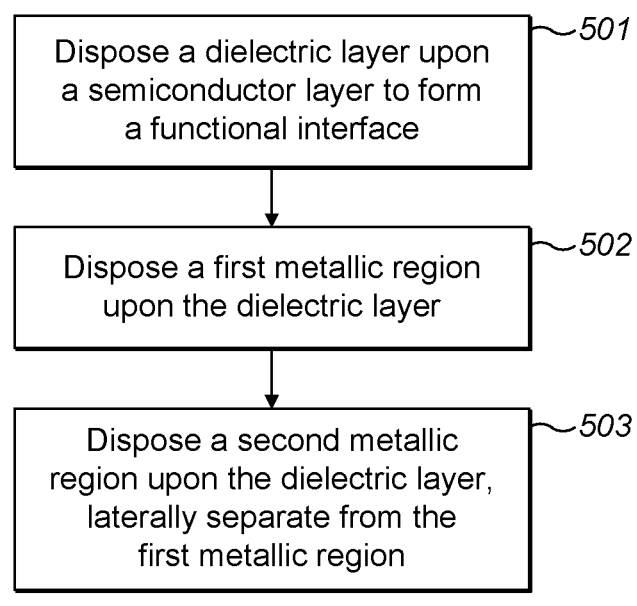
FIG. 5 is a flow chart of a method of assembling a quantum device.

FIG. 5 illustrates a method of assembling a quantum device according to an embodiment of the invention. In step 501, a dielectric layer is disposed upon a semiconductor layer to form a functional interface. The dielectric layer provides an electrically insulating layer. In an example, the semiconductor layer comprises silicon and the dielectric layer comprises silicon dioxide or a high dielectric constant material such as hafnium dioxide. In another example, the semiconductor layer comprises any one of gallium arsenide, indium arsenide, silicon germanium, graphene, carbon nanotubes or silicon carbide and the dielectric layer comprises a thermally grown oxide or a high-k dielectric material deposited using atomic layer deposition. In one example, the semiconductor layer is a nanowire with a width between 30 and 140 nanometres. In another example the semiconductor layer is a flat, plateau region and the dielectric layer comprises thin regions and thick regions. The width of the thin regions is between 30 and 140 nanometres.

In step 502, a first metallic region is disposed upon the dielectric layer. In step 503, a second metallic region is disposed upon the dielectric layer, laterally separate from the first metallic region. The lateral separation is typically between 10 and 100 nanometres. The first and second metallic regions are arranged to be electrically connected such that first and second confinement regions can be induced beneath the first and second metallic regions respectively at the functional interface. The first and second confinement regions are coupled and form a qubit having a first state and a second state. The qubit has a variable capacitance and provides a capacitor in an LC resonator circuit which can be used to measure or infer the state of the qubit.

The first and second metallic regions comprise a material with a high kinetic inductance such as titanium nitride, niobium nitride or niobium titanium nitride. The first and second metallic regions provide first and second inductors in the LC resonator circuit. In an alternative example, only the first metallic region provides an inductor in the LC resonator circuit. The LC resonator circuit has first and second resonant frequencies which depend on the value of the inductance and the variable capacitance of the qubit.

The dimensions of the first and second metallic regions affect their inductance. The length of the first and second metallic regions is typically between 7 and 100 nanometres. The length affects the size of the first and second confinement regions and the inductance: longer first and second metallic regions will result in larger first and second confinement regions and a lower inductance. The first and second metallic regions typically extend away from the confinement regions by 1 to 100 micrometres, depending on the desired inductance of the first and second metallic regions. If a larger inductance is required, the first and second metallic regions are designed to extend further.

Table 1 provides values of the kinetic inductance per square for titanium nitride (TiN), niobium nitride (NbN) and niobium titanium nitride (NbTiN). The values of the kinetic inductance have experimentally determined for the thickness given in Table 1 and have been normalised to provide a comparison of the kinetic inductance of the materials independent of the thickness. The critical temperature, $T_c$, is also given for the three materials. The experimental values for TiN were published in Shearrow et al, Applied Physics Letters: Vol 113, 212601 (2018). The experimental values for NbN were published in Hayashi et al, Journal of Physics: Conference Series, Vol. 507, 042015 (2014). The experimental values for NbTiN were published in Samkharadze et al, Physical Review Applied, Vol. 5, 044004 (2016).

TABLE 1

| | Material properties of TiN, NbN and NbTiN. | | |
|---|---|---|---|
| Material | Thickness (nm) | $T_c$ (K) | $L_k{}^*t_g$ (pH*nm/square) |
| TiN | 8.9 | <2 | 2082.6 |
| NbN | 150 | 13-15 | 183.75 |
| NbTiN | 8 | 9 | 280 |

It is noted that any material with a high kinetic inductance is suitable for use as first and/or second metallic layers of the devices described herein. Some superconductors have a high kinetic inductance. Typically, disordered superconductors have a higher kinetic inductance per square. Furthermore, superconductors with a lower critical temperature typically have a higher kinetic inductance.

The effect of the dimensions of the first and second metallic regions on their inductance can be seen using the values given in Table 2 below. Table 2 indicates exemplary values of the thickness, $t_g$, length, $L_g$, and extension, $d_g$, of each of the first and second metallic regions required to achieve an inductance of 50 nanohenries using titanium nitride.

TABLE 2

| Exemplary relative dimensions of a metallic region comprising TiN with an inductance of 50 nH | | |
|---|---|---|
| $t_g$ (nm) | $L_g$ (nm) | $d_g$ (μm) |
| 10 | 22 | 5.3 |
| 10 | 40 | 9.6 |
| 20 | 22 | 10.6 |
| 20 | 40 | 19.2 |

Following the disposal of the first and second metallic regions, another exemplary method of assembly further includes a step of disposing a masking layer to cover the first and second metallic layers. The masking layer comprises a conductive material such as polysilicon or aluminium. The device fabrication process may involve a self-aligned implantation process to define the source and drain electrodes of the device. In this case, the masking layer protects the underlying metallic region(s).

The quantum devices according to embodiments of the invention can be manufactured using industry standard complementary-metal-oxide semiconductor manufacturing processes.

Figure 6:
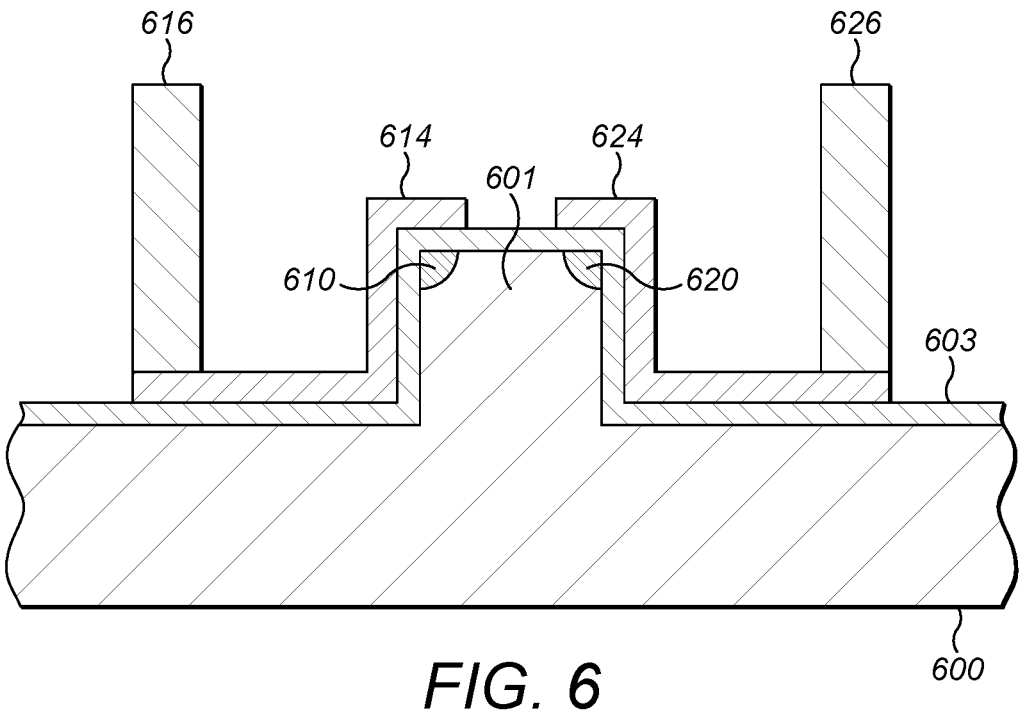
FIG. 6 is a cross-sectional side view of a quantum device.

FIG. 6 illustrates a cross-sectional side view of a quantum device according to an embodiment of the invention. In FIG. 6, the device includes a substrate 600 comprising silicon. The device comprises a silicon fin 601 protruding from the substrate 600 to form a fin field-effect transistor, FinFET. In this example, the silicon substrate 600 has been etched to form the fin 601 protruding from the remainder of the substrate.

A thin dielectric layer 603 comprising silicon dioxide is disposed on the fin 601. First and second metallic regions 614, 624 are arranged to overly the two edges of the fin 601. The first and second metallic regions 614, 624 provide first and second inductors in an LC resonator in the device. The first and second metallic regions 614, 624 extend towards first and second gate electrodes 616, 626 respectively.

A functional interface is formed between the thin dielectric layer 603 and the fin 601. The thin dielectric layer 603 covers the substrate 600 and the fin 601, but the geometry of the fin 601 strengthens the field-effect in the fin 601 when a bias is applied to the first and/or second metallic regions 614, 624. Consequently, a first quantum dot 610 can be supported in the corner of the fin 601 at the functional interface between the silicon fin 601 and the thin dielectric layer 603 and beneath the first metallic region 616. Similarly, a second quantum dot 620 can be supported in the corner of the fin 601 at the functional interface and beneath the second metallic region 626. The first and second quantum dots 610, 620 can be tunnel coupled to form a double quantum dot. The double quantum dot forms a qubit having two quantum states and provides a capacitor in the LC resonator circuit of the device. The first and second quantum dots 610, 620 can be induced by applying a bias potential to the first and second metallic regions 614, 624 respectively.

At cryogenic temperatures, each of the first and second quantum dots 610, 620 can be used to confine a single electron upon application of a suitable bias potential to the first and/or second metallic regions 614, 624. Under certain conditions, the electrons can tunnel back and forth between the quantum dots 610, 620. However, under certain conditions the tunnelling is suppressed due to spin blockade. Accordingly, the double quantum dot behaves as a variable capacitor, with a high capacitance if the tunnelling is not quantum mechanically suppressed. The maximum capacitance of the double quantum dot in this example is between 1 and 10 femtofarads. The capacitance of the device depends on the state of the qubit as well as the device geometry and the material properties. Accordingly, the resonant frequency of the LC resonator circuit is also dependent on the state of the qubit. The relationship between the state of the qubit and the resonant frequency of the LC resonator circuit can be used to infer the state of the qubit through measurement of the frequency-dependent power transmission.

Figure 7:
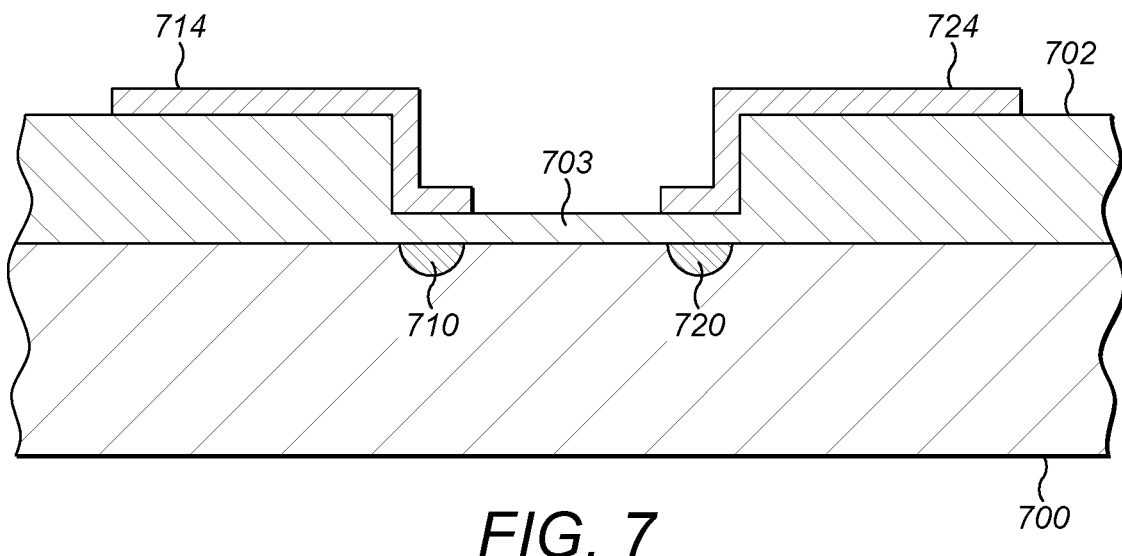
FIG. 7 is a cross-sectional side view of a quantum device.

FIG. 7 illustrates a cross-sectional side view of a quantum device according to an embodiment of the invention. In FIG. 7, the device includes a substrate 700 comprising silicon. A dielectric layer 702, 703 having non-uniform thickness overlies the substrate 700. The dielectric layer 702, 703 comprises a thin region 703 and a thick region 702. In this example the dielectric layer 702, 703 is a continuous region comprising silicon dioxide.

The thin region 703 of the dielectric layer occupies a substantially rectangular area. The rectangular area has a first edge and a second edge. The device comprises a first metallic region 714 overlying a portion of the thin region 703 and a portion of the thick region 702 of the dielectric layer at the first edge. The device comprises a second metallic region 724 overlying a portion of the thin and thick regions 703, 704 of the dielectric layer at the second edge. The first and second metallic regions 714, 724 comprise NbTiN in this example. In an alternative examples, the first and second metallic regions comprise TiN or NbN. When a bias is applied to the first and/or second metallic regions, the field effect is stronger in portions of the dielectric layer which are thinner. Consequently, a functional interface is formed between the thin dielectric layer 703 and the semiconductor layer 700 beneath the first and second metallic regions 714, 724. First and second quantum dots 710, 720 can be induced beneath the first and second metallic regions 714, 724 respectively at the functional interface.

In another example, the device comprises two thin regions and three thick regions when shown in cross-section. The thin regions may be connected to each other in a different region of the device and thick regions may also be connected to each other elsewhere. In this example, the first metallic region overlies the first thick region, the first thin region, and optionally a portion of the second thick region. The second metallic region overlies the second thin region, the third thick region, and optionally a portion of the second thick region. The first and second metallic regions are nevertheless electrically and physically separated.

The device shown in FIG. 7 illustrates a single qubit comprising a double quantum dot. The device may be scaled to support an array of qubits. Further metallic regions may be disposed overlying the dielectric layer, at least in the thin region of the dielectric layer. For example, third and fourth metallic regions may be disposed overlying the thin region of the dielectric layer, laterally separated from the first and second metallic regions.

In a further modification, the thin region(s) of the dielectric layer can be any shape. Typically the shape of each thin region of the dielectric layer comprises two parallel edges. However, the separation between the edges may vary along the length of the thin region of the dielectric layer. The thin region(s) may also be non-linear to support a two dimensional array of qubits.

Figure 8:
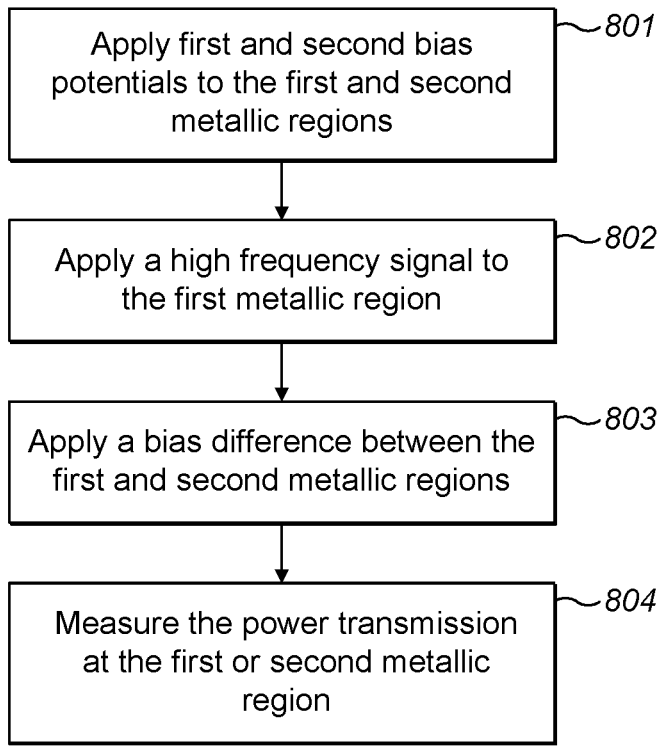
FIG. 8 is a method for performing qubit measurement or readout.

FIG. 8 illustrates a method for performing qubit measurement or readout in accordance with an embodiment of the invention. The method can be performed on any of the devices according to the embodiments of the invention described herein. Prior to carrying out the steps of the method as detailed below, the device is cooled to cryogenic temperatures. In this example the device is cooled to below 4.2 Kelvin. However, in alternative examples the operational temperature, i.e. temperature at which the method can be carried out, may differ.

The operational temperature depends on the material used for the first metallic region. In order for the first metallic region to exhibit the properties of high kinetic inductance necessary for the first metallic region to provide an inductor in the LC resonator, the first metallic region must be cooled to a temperature below the critical temperature, $T_c$. For example, the estimated critical temperature of titanium nitride is less than 2 kelvin; the estimated critical temperature of niobium nitride is 13-15 Kelvin; and the estimated critical temperature of niobium titanium nitride is 9 Kelvin.

The operational temperature also depends on the size of the quantum dot. In order to confine charge carriers in the quantum dot, the thermal energy must be much less than the charging energy of the quantum dot. A larger quantum dot will have a smaller charging energy and the operational temperature will consequently need to be lower in order to confine the charge carriers.

In step 801, a first bias potential is applied to a first metallic region and a second bias potential is applied to a second metallic region. The first and second metallic regions may be arranged in series as shown for example in FIG. 4A or in parallel as shown for example in FIG. 4B. The value of the first and second bias potentials is such that a first quantum dot is induced beneath the first metallic region at the functional interface between the semiconductor layer and the thin dielectric layer and a second quantum dot is induced beneath the second metallic region at the functional interface. The first and second bias potentials in this example are substantially the same and are approximately 0.5 volts. The appropriate value for the first and second bias potentials will depend on the device geometry.

At cryogenic temperatures, the magnitude of the first and second bias potentials can be chosen to confine a single electron, or a few electrons, in each of the first and second quantum dots. In this example, a single electron is confined in each of the quantum dots.

The first and second quantum dots are tunnel coupled so as to form a double quantum dot. Under certain conditions, single electrons can tunnel from the first quantum dot to the second quantum dot, and from the second quantum dot to the first quantum dot. When single electrons tunnel between the two quantum dots, the capacitance of the double quantum dot is relatively large.

The double quantum dot forms a qubit having two quantum states defined by the relative electron spin states in the first and second quantum dots. In this example, when the electron spins are anti-parallel, the qubit is in a first state and when the electron spins are parallel, the qubit is in a second state. The capacitance of the first qubit state is larger than that of the second qubit state, as the tunnelling is suppressed in the second state due to spin blockade.

In step 802, a high frequency signal is applied to the first metallic region using a power source. The frequency of the high frequency signal corresponds to a resonant frequency of the LC resonator circuit comprising the double quantum dot and the first and second metallic regions. The resonant frequency of the LC resonator circuit depends on the capacitance of the double quantum dot. The capacitance of the double quantum dot depends on the state of the qubit as described above.

In this example, the frequency of the high frequency signal corresponds to the resonant frequency of the LC resonator circuit when the qubit is in the first state. The larger capacitance corresponds to a lower resonant frequency. Application of a lower frequency signal results in less parasitic loss.

In step 802, the amplitude of the high frequency excitation is chosen such that it is smaller than the tunnel coupling voltage, $V_{in}$, between the quantum dots. Accordingly, no electrons are tunnelling between the first and second quantum dots. The tunnel coupling voltage is determined by the following equation $$V_{in} = \frac{\Delta}{2Qe\alpha}$$

wherein e is the charge of the electron, $\alpha$ is the gate lever arm, $\Delta$ is the tunnel coupling energy and Q is the quality factor of the LC resonator. The gate lever arm is defined as the difference between the ratios of the gate capacitance of the first metallic region to the first and second quantum dot respectively and the total capacitance of each quantum dot. In an example, $\alpha$=0.5, $\Delta$=10 µeV and Q=1000, resulting in a tunnel coupling voltage $V_{in}$=10 nV.

In step 803, a bias difference is applied between the first and second metallic regions. The bias difference is small in comparison with the first and second bias potentials applied in step 801. The bias difference is larger than the tunnel coupling voltage. Typically, the bias difference is a few millivolts. The bias difference is selected such that when there is the selected bias difference between the first and second metallic regions and a high frequency signal is being applied to the first metallic region, if the qubit is in the first state, the electrons will tunnel back and forth between the first and second quantum dots resulting in a high capacitance state. Alternatively, if the qubit is in the second state, the tunnelling will be greatly suppressed resulting in a low capacitance state.

In step 804, the power transmission through the LC resonator circuit is measured using a probe connected to the first or second metallic region. If the qubit is in the first state, the resonant frequency will match the frequency of the high frequency signal and the power transmission will be high. If the qubit is in the second state, the power transmission will be low. The reflected power transmission, $S_{11}$, can be measured using a probe connected to the first metallic region. Alternatively, the forward power transmission, $S_{21}$, can be measured using a probe connected to the second metallic region.

In this example the measurement of the power transmission is performed using a vector network analyser. In an alternative example, the power transmission can be measured using a high-frequency voltage source and a power sensor. The power sensor may be a diode, for example.

In an alternative example, the high frequency signal in step 802 corresponds to the resonant frequency of the second state of the qubit. In this example, if the qubit is in the first state, the resonant frequency of the circuit will not match the frequency of the high frequency signal and the power transmission will be low. If the qubit is in the second state, the power transmission will be high.

Figure 9:
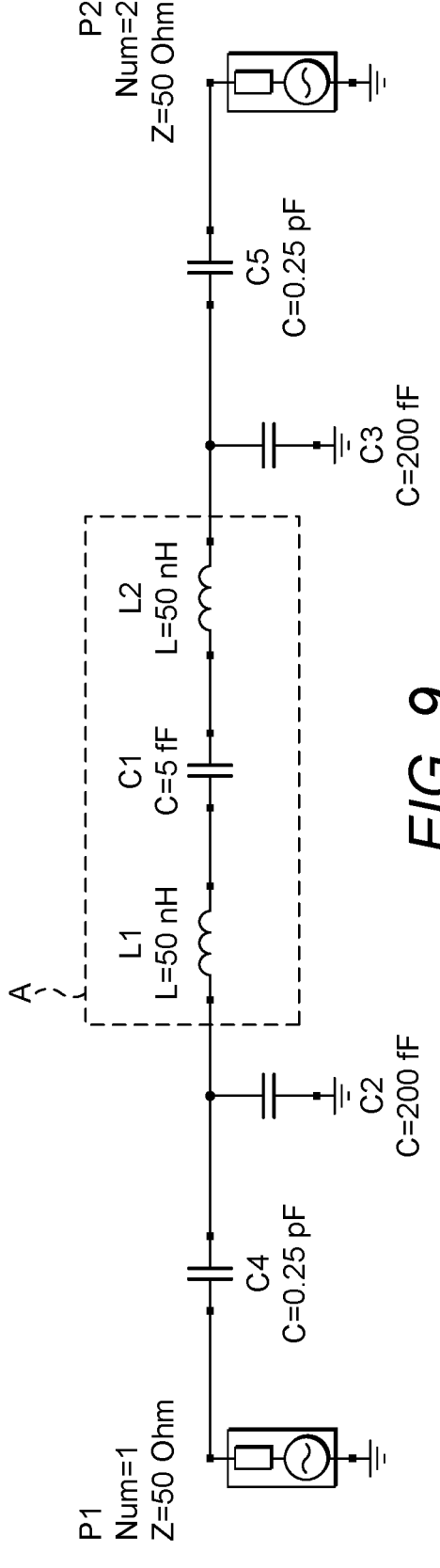
FIG. 9 is a circuit diagram representing a quantum device.

FIG. 9 is a circuit diagram representing a quantum device according to an embodiment of the invention. The device is represented in the dashed area A. The first metallic region provides a first inductor L1 in the LC resonator circuit with a first inductance. The second metallic region provides a second inductor L2 in the LC resonator circuit with a second inductance. The first and second inductors L1, L2 are in series with the double quantum dot which provides a first capacitor C1 in the LC resonator circuit. It is noted that the capacitance of the double quantum dot varies according to the state of the qubit.

The off-chip detection electronics are also illustrated in the circuit diagram. The circuit can be engineered using the additional components to tune the operational frequency of the circuit. Second and third capacitors C2, C3 represent the parasitic capacitance of the off-chip detection electronics. The second and third capacitors C2, C3 represent the total parasitic capacitance and in this example the capacitance is approximately 200 femtofarads for each of the second and third capacitors C2, C3. In alternative examples, the capacitance of the second capacitor C2 may be different from the capacitance of the third capacitor C3.

Fourth and fifth capacitors C4, C5 represent decoupling capacitors. In this example, the capacitance of each of the fourth and fifth capacitors C4, C5 is approximately 0.25 picofarads. The decoupling capacitors allow maximum power transfer to the device, which provides maximum sensitivity for measurement of the qubit state. The fourth and fifth capacitors C4, C5 can be used to tune the maximum power transfer through the circuit at resonance.

The circuit may further include first and second bias tees (not shown) which can be used to offset the DC bias of the first and second metallic regions such that the device is at the qubit operation point. Each of the bias tees may comprise a large resistor with a resistance greater than 1 megaohm and may be positioned in between the decoupling capacitors and the device.

Figure 10A:
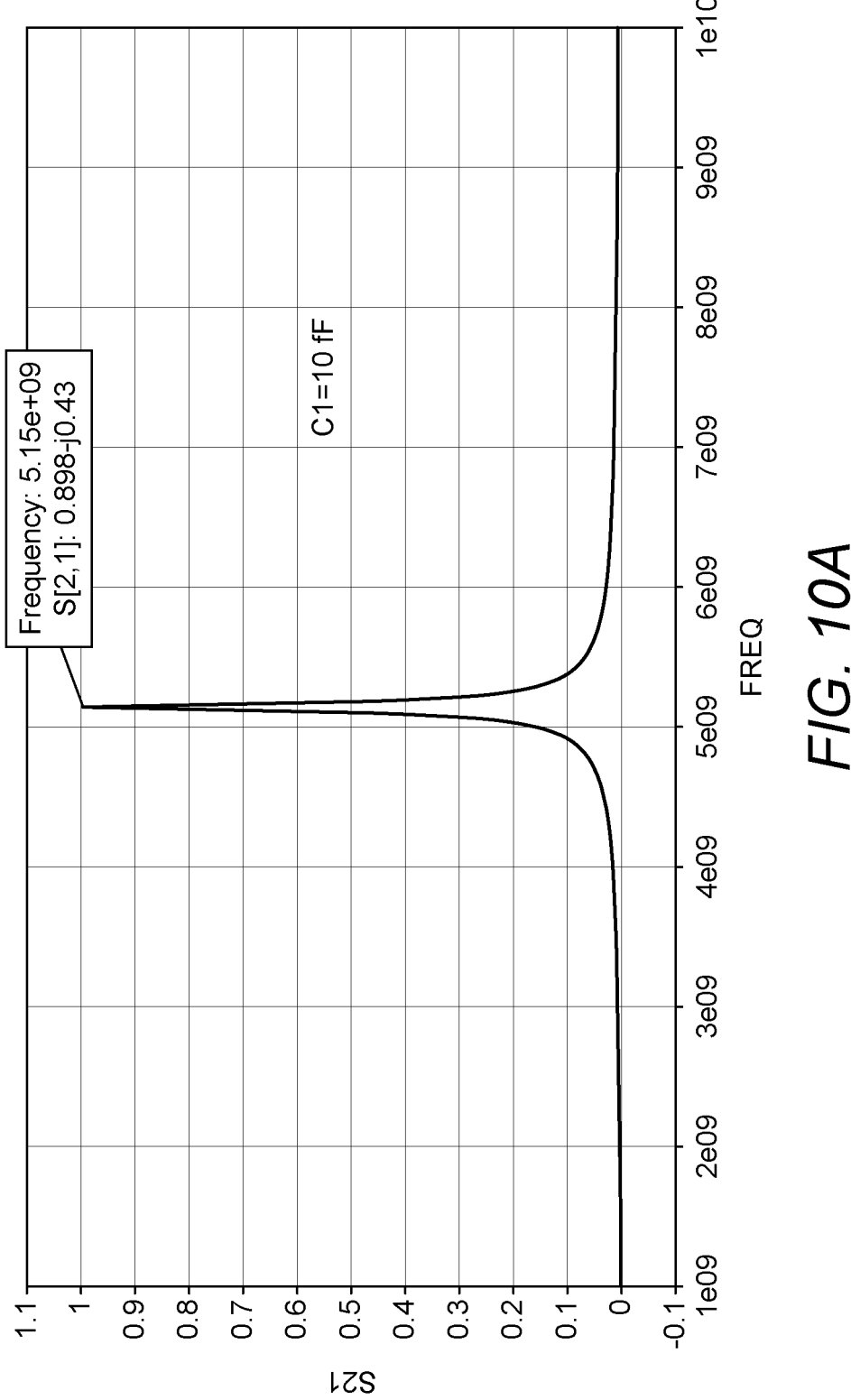
FIG. 10A is a graph illustrating power transmission as a function of frequency for a first capacitance.
Figure 10B:
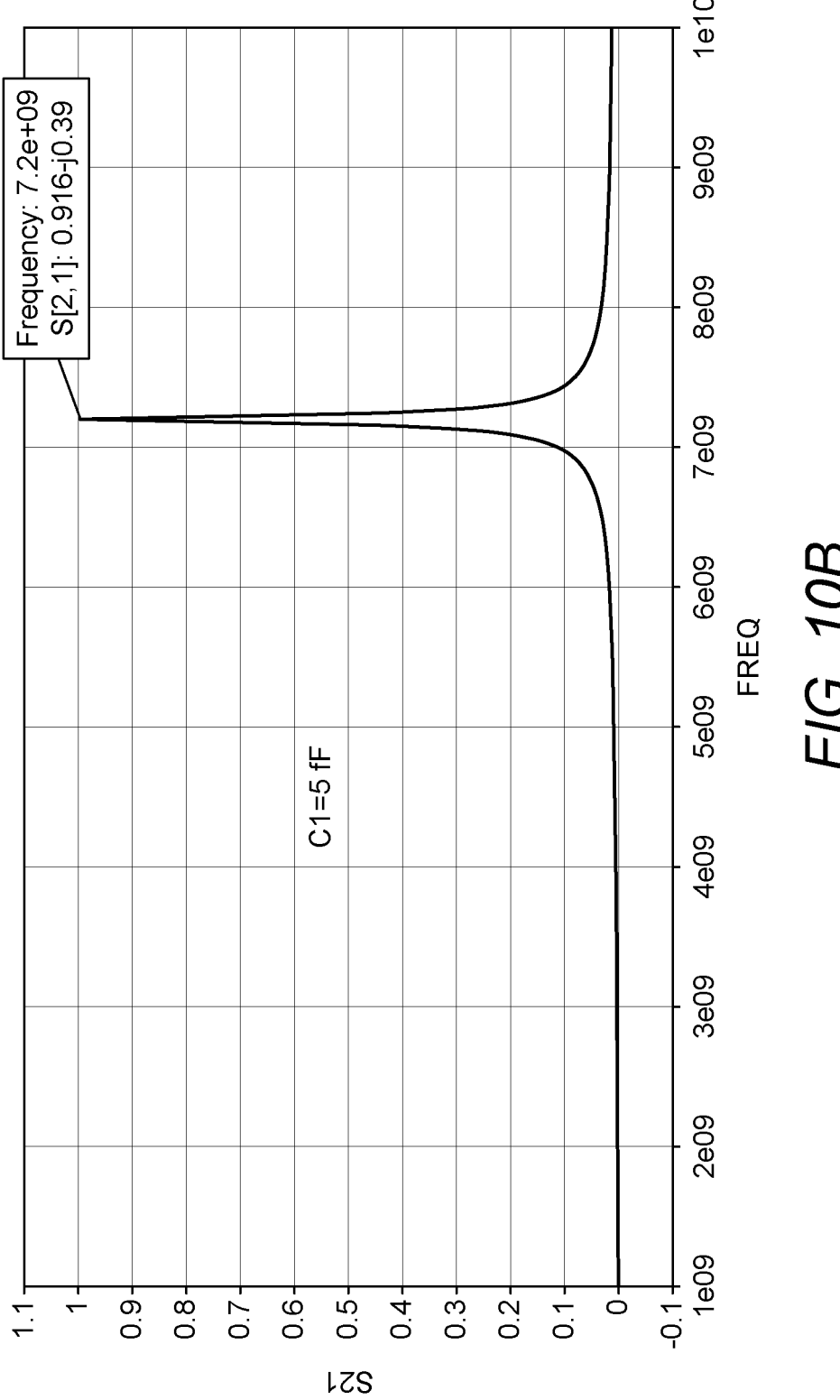
FIG. 10B is a graph illustrating power transmission as a function of frequency for a second capacitance.

The resonant frequency of the circuit illustrated in FIG. 9 is dependent on the first and second inductors and the first, second, third, fourth and fifth capacitors. Maximum power transfer occurs at the resonant frequency of the circuit. FIGS. 10A and 10B illustrate forward power transmission, $S_{21}$, as a function of frequency for two values of the first capacitance. The response of the circuit has been simulated.

FIG. 10A illustrates the forward power transmission at a first capacitance of 10 femtofarads. Using these input values, the resonant frequency of the circuit is expected to be approximately 5.15 gigahertz. At a second value of the first capacitance, 5 femtofarads, the resonant frequency of the circuit is expected to be approximately 7.20 gigahertz, as shown in FIG. 10B.

Figure 11A:
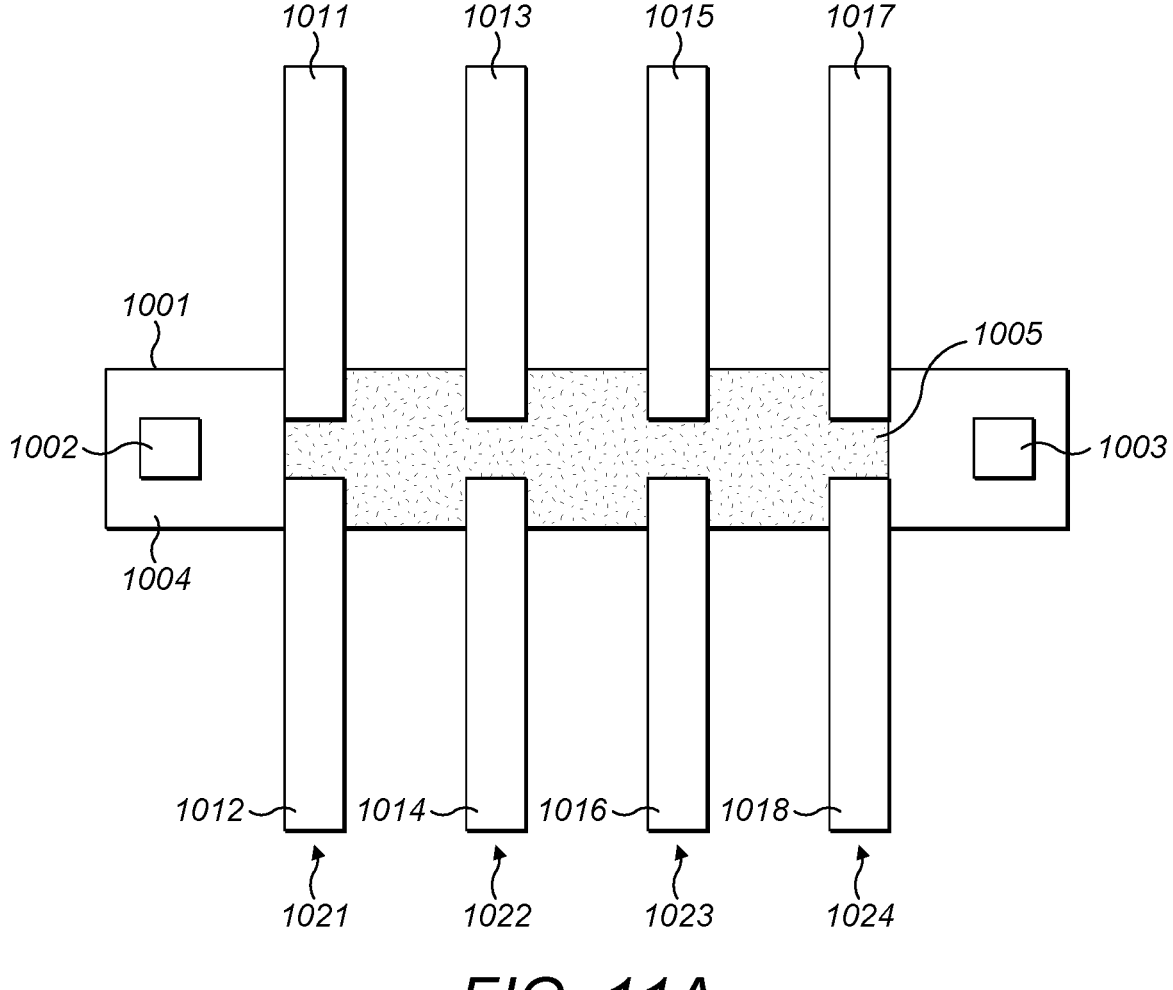
FIG. 11A is a plan view of a quantum device.
Figure 11B:
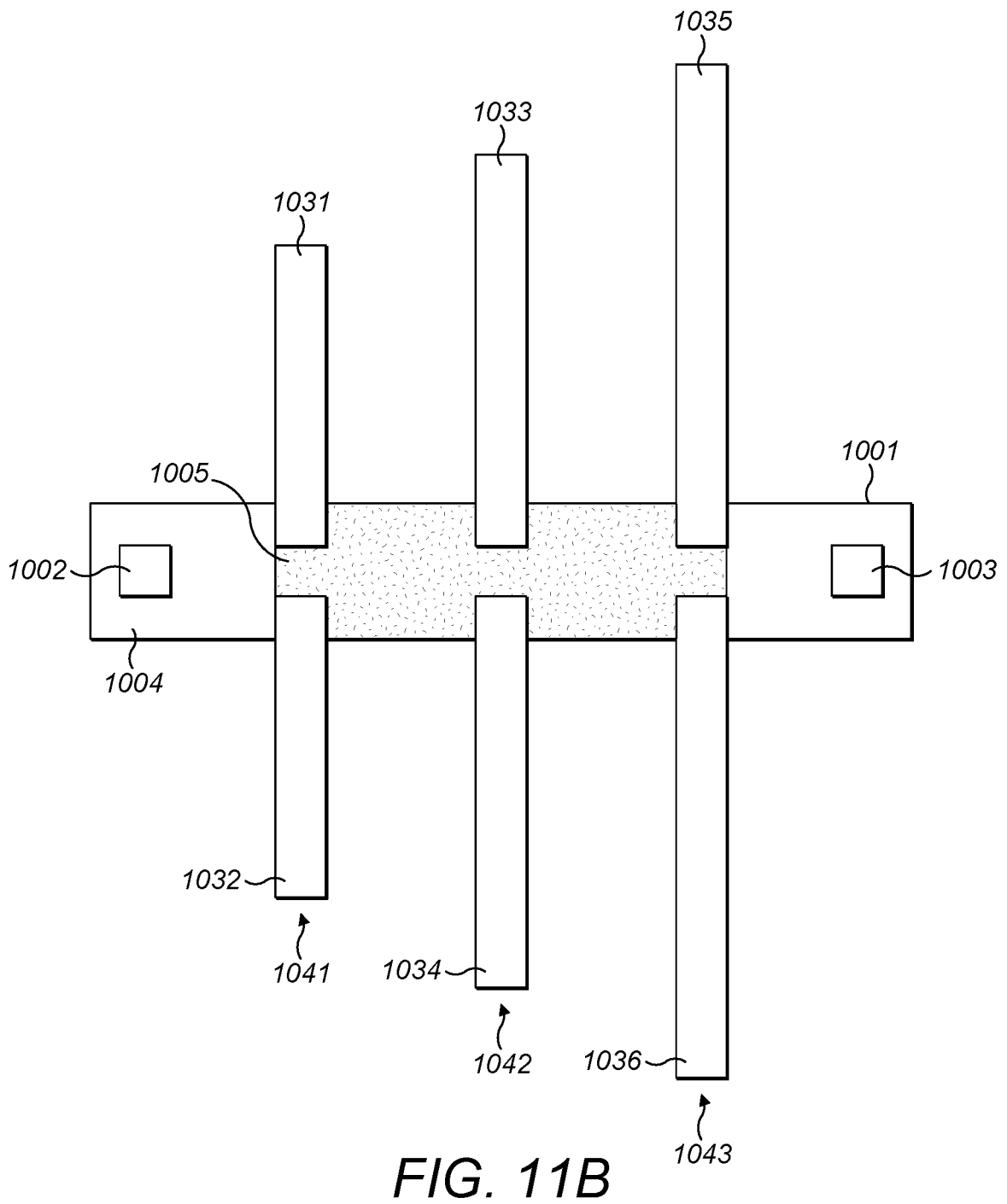
FIG. 11B is a plan view of a quantum device.

FIGS. 11A and 11B schematically illustrate plan views of quantum devices according to embodiments of the invention. The devices each comprise a source electrode 1002 and a drain electrode 1003 which are electrically connected to an external power source. The devices may comprise high frequency multiplexers to reduce the number of high frequency sources and detectors necessary for reading out the state of a plurality of qubits.

The device architectures shown illustrate one nanowire 1001 with multiple qubit unit cells 1021-1024, 1041-1043. FIGS. 11A and 11B schematically indicate highly doped regions 1004 and an undoped region 1005. FIG. 11A illustrates four qubit unit cells 1021-1024; FIG. 11B illustrates three qubit unit cells 1041-1043. For reference, FIGS. 4B and 6 illustrates similar devices with a single qubit unit cell.

In FIG. 11A, the nanowire is a silicon germanium, SiGe, nanowire. In an alternative example the nanowire is an indium arsenide, InAs, nanowire. Each qubit unit cell 1021-1024 comprises two metallic regions 1011-1018 positioned on opposing sides of the SiGe nanowire 1001. The undoped region 1005 of the nanowire 1001 extends beneath the metallic regions 1011-1018 to the edges of the nanowire 1001 and the metallic regions 1011-1018 are electrically separated from the nanowire 1001 by a thin dielectric layer (not shown). A first qubit unit cell 1021 comprises first and second metallic regions 1011, 1012. A second qubit unit cell 1022 comprises third and fourth metallic regions 1013, 1014. A third qubit unit cell 1023 comprises fifth and sixth metallic regions 1015, 1016. A fourth qubit unit cell 1024 comprises seventh and eight metallic regions 1017, 1018. In alternative examples, the device comprises further qubit unit cells, or fewer qubit unit cells. The separation between the source and drain electrodes 1002, 1003 can be modified according to the number of qubit unit cells. Each metallic region 1011-1018 is electrically connected to a gate electrode (not shown). The metallic regions 1011-1018 provide the only inductors in the device. There are no external inductors.

In this example, each of the qubit unit cells have substantially the same geometric properties and consequently have similar electronic properties. For example, each of the metallic regions 1011-1018 are substantially the same length and consequently have substantially the same inductance. Accordingly, the resonant frequency of each qubit unit cell 1021-1024 will be similar. The state of each qubit may be measured or inferred by performing a sequential measurement of the qubit in the first qubit unit cell 1021, the qubit in the second qubit unit cell 1022, the qubit in the third qubit unit cell 1023 and the qubit in the fourth qubit unit cell 1024.

Furthermore, the separation between each pair of metallic regions (i.e. first and second metallic regions 1011, 1012; third and fourth metallic regions 1013, 1014; fifth and sixth metallic regions 1015, 1016; and seventh and eighth metallic regions 1017, 1018) is substantially the same. It follows that the double quantum dot qubits which can be induced in each qubit unit cell 1021-1024 will have similar electronic properties, accounting for variations resulting from device imperfections. Device imperfections may arise from material defects or processing irregularities, for example.

The qubit unit cells 1021-1024 are separated along the longitudinal axis of the nanowire 1001. The third and fourth metallic regions are laterally separated from the first and second metallic regions along the longitudinal axis of the nanowire. The lateral separation is between each of the adjacent metallic regions such that there is no overlap. The separation between qubit unit cells is substantially the same in this example. For example, the separation between the first metallic region 1011 in the first qubit unit cell 1021 and the third metallic region 1013 in the second qubit unit cell 1022 is between 10 and 100 nanometres.

In alternative examples, the separation between adjacent qubit unit cells may be different. For example, the separation between the first and third metallic regions 1011, 1013 may be greater than the separation between the third and fifth metallic regions 1013, 1015. However, the arrangement of metallic regions along the nanowire is substantially symmetric and thus the separation between the first and third metallic regions 1011, 1013 is the same as the separation between the second and fourth metallic regions 1012, 1014, allowing for manufacturing tolerances.

In FIG. 11B, the nanowire 1001 comprises silicon. A first qubit unit cell 1041 comprises first and second metallic regions 1031, 1032; a second qubit unit cell 1042 comprises third and fourth metallic regions 1033, 1034; and a third qubit unit cell 1043 comprises fifth and sixth metallic regions 1035, 1036. In alternative examples, the device comprises further qubit unit cells, or fewer qubit unit cells. Each metallic region 1031-1036 is electrically connected to a gate electrode (not shown). The metallic regions 1031-1036 are the only inductors in the LC resonator circuits of the device. The undoped region 1005 of the nanowire 1001 extends beneath the metallic regions 1031-1036 to the edges of the nanowire 1001 and the metallic regions 1031-1036 are electrically separated from the nanowire 1001 by a thin dielectric layer (not shown).

In this example, the separation between pairs of metallic regions within each qubit unit cell 1041-1043 is substantially the same and the separation between adjacent metallic regions along both edges of the nanowire is substantially the same, as described in relation to FIG. 11A. However, in the device shown in FIG. 11B, each qubit unit cell 1041-1043 has a different resonant frequency due to the different extensions of the metallic regions 1031-1036. In this example, each pair of metallic regions extends by substantially the same distance. This facilitates the fabrication process and may simplify data extraction. In this example, the first and second metallic regions 1031, 1032 extend the least far. The extension of the third and fourth metallic regions 1033, 1034 is slightly further than that of the first and second metallic regions 1031, 1032. The fifth and sixth metallic regions 1031, 1036 extend the furthest. Accordingly, the inductance of each of the first and second metallic regions 1031, 1032 is less than that of each of the third and fourth metallic regions 1033, 1034, and the inductance of each of the fifth and sixth metallic regions 1035, 1036 is the greatest.

In an alternative example, the second, fourth and sixth metallic regions 1032, 1034, 1036 may extend by substantially the same amount, and only the first, third and fifth metallic regions 1031, 1033, 1035 have differing extensions. The total inductance of each qubit unit cell is still modified in this arrangement.

In a further example, only the first, third and fifth metallic regions 1031, 1033, 1035 provide the only inductors in their respective qubit unit cells 1041, 1042, 1043. The second, fourth and sixth metallic regions 1032, 1034, 1036 may comprise polysilicon and be of any size; their size does not affect the inductance of the LC resonator circuits. Again, the first, third and fifth metallic regions 1031, 1033, 1035 can extend different distances to effect a variation in inductance between the LC resonator circuits.

Due to the different inductances and thus the different resonant frequencies of the first, second and third qubit unit cells 1041-1043, the state of each qubit may be measured or inferred using frequency-domain multiplexing.

FIG. 8 describes a method for performing qubit measurement or readout for a device with a single qubit unit cell. For a device with a plurality of qubit unit cells, time-domain and/or frequency-domain multiplexing can be employed to measure or infer the state of the qubit in each qubit unit cell.

For example, a time-domain multiplexing method may be used to measure the state of each of the qubits in the device shown in FIG. 11A. In this example, a high frequency signal is applied to the first metallic region and the state of the qubit in the first qubit unit cell is subsequently measured or inferred at the second metallic region. A high frequency signal is then applied to the third metallic region and the state of the qubit in the second qubit unit cell is measured or inferred at the fourth metallic region.

For the device shown in FIG. 11B, a frequency-domain multiplexing method may be used to measure the state of each of the qubits. In this example, the state of each of the qubits can be measured or inferred simultaneously.

In an alternative example, a combination of time- and frequency-domain multiplexing methods may be employed. For example, a device may comprise some qubit unit cells with the same dimensions and some qubit unit cells with different dimensions. The particular implementation of the device and method used will depend on the desired device characteristics and any practical limitations such as the geometry. For example, for a device with twenty qubit unit cells, it may not be suitable to have twenty different extensions, as the inductance of the smallest metallic regions may be below a desired value, and the size of the largest metallic regions may result in a large parasitic capacitance and/or result in geometric constraints.

As will be appreciated, a quantum device having an LC resonator circuit for performing qubit measurement or readout is disclosed along with a method for performing qubit measurement or readout using the device and a method of assembling the device. The LC resonator circuit in the device comprises a capacitor and an inductor. The inductor is provided by a metallic region comprising a material with a high kinetic inductance. The metallic region is also suitable for inducing a quantum dot which can be used to confine one or more electrons. A double quantum dot forming a qubit having two states can be induced using two nearby metallic regions. The capacitor in the LC resonator circuit is provided by the double quantum dot qubit which has a capacitance which varies depending on the state of the qubit. The resonant frequency of the LC resonator circuit depends on the capacitance. The power transmission through the LC resonator circuit is frequency dependent and is at a maximum at the resonant frequency of the circuit. The state of the qubit affects the capacitance which in turn affects the resonant frequency. Accordingly, measurement of the power transmission at a resonant frequency of the circuit can be used to infer the state of the qubit. The dual function of the first metallic region, i.e. to induce a quantum dot and to provide an inductor in the LC resonator, together with the use of a material with a high kinetic inductance to form the first metallic region, results in a compact device with qubit readout capabilities.

The invention claimed is:

1. A quantum device having an LC resonator circuit for performing qubit measurement or readout, the device comprising:

a semiconductor layer;

a dielectric layer disposed upon and forming a functional interface with the semiconductor layer;

a first metallic region disposed upon the dielectric layer; and a second metallic region disposed upon the dielectric layer and laterally separated from the first metallic region;

wherein the first and second metallic regions are arranged to be electrically connected such that a double quantum dot, forming a qubit having a first state and a second state, can be induced beneath the first and second metallic regions at the functional interface;

wherein the double quantum dot provides a capacitor in the LC resonator circuit and the capacitance of the double quantum dot is dependent on the state of the qubit;

wherein the first metallic region provides an inductor in the LC resonator circuit; and wherein the resonant frequency of the LC resonator circuit is dependent on the state of the qubit such that the state of the qubit can be measured or inferred.

2. A quantum device according to claim 1, wherein the first metallic region comprises a superconductor.

3. A quantum device according to claim 1, further comprising:

a power source configured to supply power at a frequency corresponding to a resonant frequency of the LC resonator circuit; and a probe connected to the first and/or second metallic region and configured to measure the power transmission through the LC resonator circuit to infer the state of the qubit.

4. A quantum device according to claim 1, wherein the first metallic region provides a first inductor in the LC resonator circuit and the second metallic region provides a second inductor in the LC resonator circuit.

5. A quantum device according to claim 1, further comprising a masking layer covering the first metallic region.

6. A quantum device according to claim 1, wherein the semiconductor layer comprises a nanowire, and wherein the first and second metallic regions are laterally separated along the longitudinal axis of the nanowire.

7. A quantum device according to claim 1, wherein the dielectric layer comprises a thin region and a thick region and wherein the functional interface is formed between the semiconductor layer and the thin region of the dielectric layer.

8. A method for performing qubit measurement or readout using the device according to claim 1, comprising the steps of:

applying first and second bias potentials to the first and second metallic regions respectively to induce a double quantum dot, forming a qubit having a first state and a second state, beneath the first and second metallic regions at the functional interface, wherein the first and second bias potentials are substantially the same;

applying a signal to the first metallic region with a selected frequency;

applying a bias difference between the first and second metallic regions; and measuring the power transmission at the first or second metallic region, wherein the measurement is used to measure or infer the state of the qubit.

9. A method according to claim 8, wherein the selected frequency is the resonant frequency of the circuit when the capacitance of the double quantum dot is maximum.

10. A method according to claim 8, wherein the method is performed at a temperature below 20 Kelvin.

11. A quantum device according to claim 1, wherein the semiconductor layer comprises a nanowire, and wherein the first and second metallic regions are disposed on opposing sides of the nanowire such that each of the first and second metallic regions partially overlaps one edge of the nanowire and includes respective portions that extend away from the nanowire.

12. A quantum device according to claim 11, further comprising:

third and fourth metallic regions disposed upon the dielectric layer;

wherein the third and fourth metallic regions are disposed on opposing sides of the nanowire such that each of the third and fourth metallic regions partially overlaps one edge of the nanowire and includes respective portions that extend away from the nanowire;

wherein the third and fourth metallic regions are laterally separated from the first and second metallic regions along the longitudinal axis of the nanowire;

wherein the first and second metallic regions are arranged to be electrically connected such that a first double quantum dot can be induced beneath the first and second metallic regions at the functional interface; and wherein the third and fourth metallic regions are arranged to be electrically connected such that a second double quantum dot can be induced beneath the third and fourth metallic regions at the functional interface.

13. A quantum device according to claim 12, wherein the inductance of each of the third and fourth metallic regions is greater than the inductance of each of the first and second metallic regions.

14. A method of assembling a quantum device according to claim 1, comprising the steps of:

disposing a dielectric layer upon a semiconductor layer to form a functional interface; and disposing a first metallic region upon the dielectric layer; and disposing a second metallic region upon the dielectric layer, laterally separate from the first metallic region;

wherein the first and second metallic regions are configured to be electrically connected such that a double quantum dot, forming a qubit having a first state and a second state, can be induced beneath the first and second metallic regions at the functional interface;

wherein the double quantum dot provides a capacitor in the LC resonator circuit and the capacitance of the double quantum dot is dependent on the state of the qubit;

wherein the first metallic region provides an inductor in the LC resonator circuit; and wherein the resonant frequency of the LC resonator circuit is dependent on the state of the qubit such that the state of the qubit can be measured or inferred.

\* \* \* \* \*